(12) United States Patent
Groth et al.

(10) Patent No.: US 11,829,306 B2
(45) Date of Patent: *Nov. 28, 2023

(54) STORAGE UNITS AND CASINGS

(71) Applicant: Rimage Corporation, Golden Valley, MN (US)

(72) Inventors: Darren Allen Groth, Fridley, MN (US); Phillip Charles Salisbury, Golden Valley, MN (US); Andrew James Nelson, Hopkins, MN (US)

(73) Assignee: Rimage Corporation, Golden Valley, MN (US)

( * ) Notice: Subject to any disclaimer, the term of this patent is extended or adjusted under 35 U.S.C. 154(b) by 704 days.

This patent is subject to a terminal disclaimer.

(21) Appl. No.: 16/878,959

(22) Filed: May 20, 2020

(65) Prior Publication Data

US 2020/0278939 A1 Sep. 3, 2020

Related U.S. Application Data

(63) Continuation-in-part of application No. 16/598,225, filed on Oct. 10, 2019, now Pat. No. 11,556,725.

(Continued)

(51) Int. Cl.
*G06F 13/16* (2006.01)
*G06F 13/42* (2006.01)
(Continued)

(52) U.S. Cl.
CPC ... *G06F 13/1668* (2013.01); *G05B 19/41805* (2013.01); *G06F 13/4282* (2013.01); *H05K 5/0247* (2013.01); *H05K 5/0278* (2013.01); *B41J 3/4073* (2013.01); *G05B 2219/45055* (2013.01); *G06F 2213/0042* (2013.01); *G06K 2215/0097* (2013.01)

(58) Field of Classification Search
CPC .......... B23P 19/00; B23P 21/00; G06F 13/16; G06F 13/42; H05K 13/04; H05K 13/08; H05K 5/00; H05K 5/02
See application file for complete search history.

(56) References Cited

U.S. PATENT DOCUMENTS 6,434,007 B1 * 8/2002 Salmonson ......... H01L 23/4093
174/16.3
7,307,849 B2 12/2007 Ho et al.
(Continued)

FOREIGN PATENT DOCUMENTS

| EP | 2 100 487 B1 | 8/2011 |
| WO | 2010/076616 A1 | 7/2010 |
| WO | 2020/077108 A1 | 4/2020 |

OTHER PUBLICATIONS

International Search Report and Written Opinion for Application No. PCT/US2021/032714 dated Sep. 14, 2021.
(Continued)

*Primary Examiner* — Thien M Le
(74) *Attorney, Agent, or Firm* — Merchant & Gould P.C.

(57) ABSTRACT

An example storage unit for a Universal Serial Bus drive can include: a casing integrated with a Universal Serial Bus data interface; a memory chip; a connector that couples the memory chip to the casing; and opposing tines extending from the connector, the opposing tines being flexible to allow the storage unit to be inserted and retained in an outer casing.

20 Claims, 36 Drawing Sheets

Related U.S. Application Data

(60) Provisional application No. 62/744,742, filed on Oct. 12, 2018.

(51) Int. Cl.
  *H05K 5/02* (2006.01)
  *G05B 19/418* (2006.01)
  *B41J 3/407* (2006.01)

(56) References Cited

U.S. PATENT DOCUMENTS

| | | | |
|---|---|---|---|
| 7,364,445 B1 | 4/2008 | Ni et al. | |
| 7,957,132 B2* | 6/2011 | Fried | F28D 15/0266 361/694 |
| 10,058,003 B1 | 8/2018 | Wang | |
| 2002/0168205 A1 | 11/2002 | Suden et al. | |
| 2003/0035276 A1* | 2/2003 | Hedler | H01L 24/72 361/764 |
| 2005/0059924 A1* | 3/2005 | Katz | A61M 5/1723 604/20 |
| 2005/0225315 A1* | 10/2005 | Goldsmith | G01R 1/0433 324/756.02 |
| 2005/0262398 A1* | 11/2005 | Pan | G06F 11/1666 714/36 |
| 2006/0001159 A1* | 1/2006 | Garcia | H01L 24/17 257/E21.511 |
| 2008/0122878 A1 | 5/2008 | Keefe et al. | |
| 2008/0188795 A1* | 8/2008 | Katz | G16H 20/17 604/66 |
| 2009/0203262 A1 | 8/2009 | Collet et al. | |
| 2010/0124827 A1* | 5/2010 | Blair | H05K 7/10 439/63 |
| 2016/0141807 A1* | 5/2016 | Gailus | H01R 13/6473 439/607.05 |
| 2020/0286191 A1* | 9/2020 | Bazhinov | G06Q 30/0207 |

OTHER PUBLICATIONS

International Search Report and Written Opinion in PCT/US2019/055670 dated Feb. 4, 2020, 18 pages.

\* cited by examiner

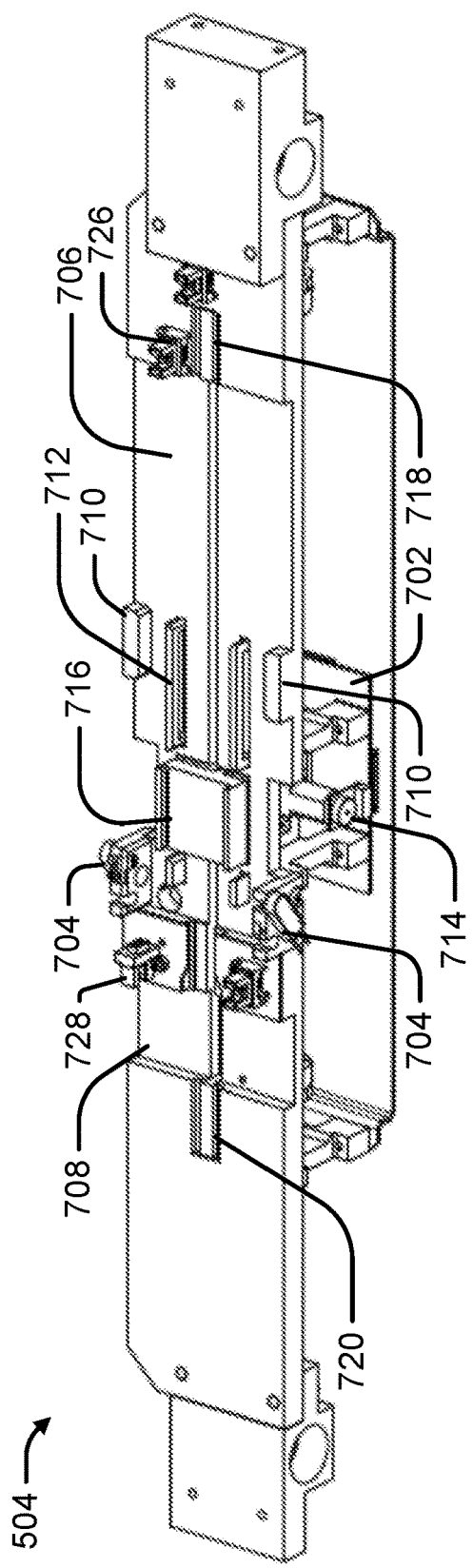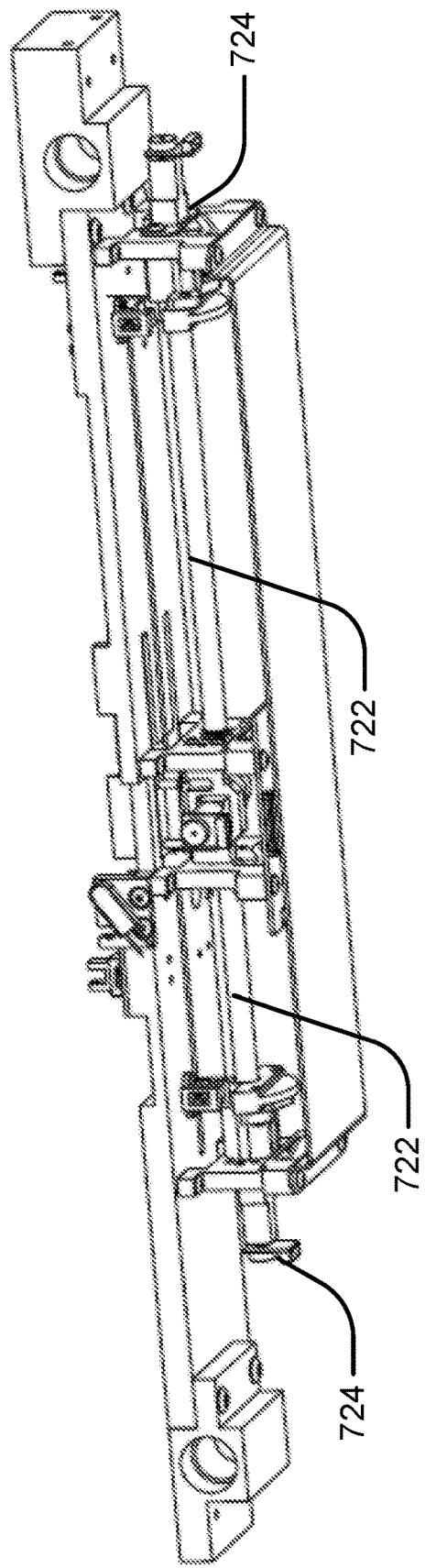
FIG. 7a
FIG. 7b

STORAGE UNITS AND CASINGS

RELATED APPLICATION(S)

This patent application is related to U.S. patent application Ser. No. 16/598,225 filed on Oct. 10, 2019, the entirety of which is hereby incorporated by reference.

BACKGROUND

The present disclosure relates to a system and method of use for automating the processing steps required for producing multiple copies of pre-recorded information; more particularly, it relates to an apparatus for automatically publishing digital content to storage units.

The problem today of publishing digital content on a data storage unit, such as a USB, SD or other storage device, is identifying content or data that is stored on the unit by the labeling of the drive. Such storage units are manufactured without any content stored on the flash and either have no labeling on them, or they are labeled with a branded logo. To add content to a storage unit, they are individually connected to a device and data is transferred to the drive. If the drive is not labeled the drive is manually moved to a printer and a label/image is applied. There is no solution today that verifies the content on the storage unit matches the label artwork applied to the storage unit.

The system and method described herein provides a compact, faster, automated improvement of content publishing, eliminates errors and offers other advantages over the prior art.

SUMMARY

The disclosure provides a solution that allows parallel processing of the image data and the digital content data and avoids the human error inherent in current methods. A significant time reduction may be achieved by storing the data while preprinting the image to a transfer sheet prior to transferring the image to the storage unit. This solution allows for each storage unit to have its unique data and be labeled with its own unique label within an automated workflow, assuring that the image printed on the drive directly correlates to the data stored on the drive. The system assures the finished unit is manufactured to specifications of the job and is functional.

An automated storage unit publishing system comprises a recording device for recording information on a storage unit memory chip; a bin plate with a storage unit bin and a casing bin; an assembling mechanism movably attached to the bin plate, the assembling deck comprising a shuttle for removing a selected sized casing from the casing bin and a recorded flash memory chip from the chip bin and assembling the two into a single unit using pressure; a printing device for printing marks, indications or decoration on the casing, and a gripping device for placing the finished unit in an output mechanism.

The features, functions and advantages that have been discussed may be achieved independently in various embodiments of the present invention or may be combined with yet other embodiments, further details of which can be seen with reference to the following description and drawings.

BRIEF DESCRIPTION OF THE DRAWINGS

FIGS. 7a and 7b illustrates upper and underside views of an assembler subsystem.

DETAILED DESCRIPTION

Embodiments of the claimed subject matter will now be described more fully with reference to the accompanying drawings, in which some, but not all embodiments are shown. The subject matter disclosed may be embodied in many different forms and should not be construed as limited to the embodiments set forth herein; rather, these embodiments are provided so that the disclosure may satisfy legal requirements. Like numbers refer to like elements throughout.

Where possible, any terms expressed in the singular form herein are meant to also include the plural form and vice versa, unless explicitly stated otherwise. Also, as used herein, the term "a" and/or "an" shall mean "one or more," even though the phrase "one or more" is also used herein. Furthermore, when it is said herein that something is "based on" something else, it may be based on one or more other things as well. In other words, unless expressly indicated otherwise, as used herein "based on" means "based at least in part on" or "based at least partially on." It should also be understood that while some embodiments describe the methods or products as comprising one or more elements, the methods or elements may also consist of or consist essentially of the elements disclosed herein.

Figure 1:
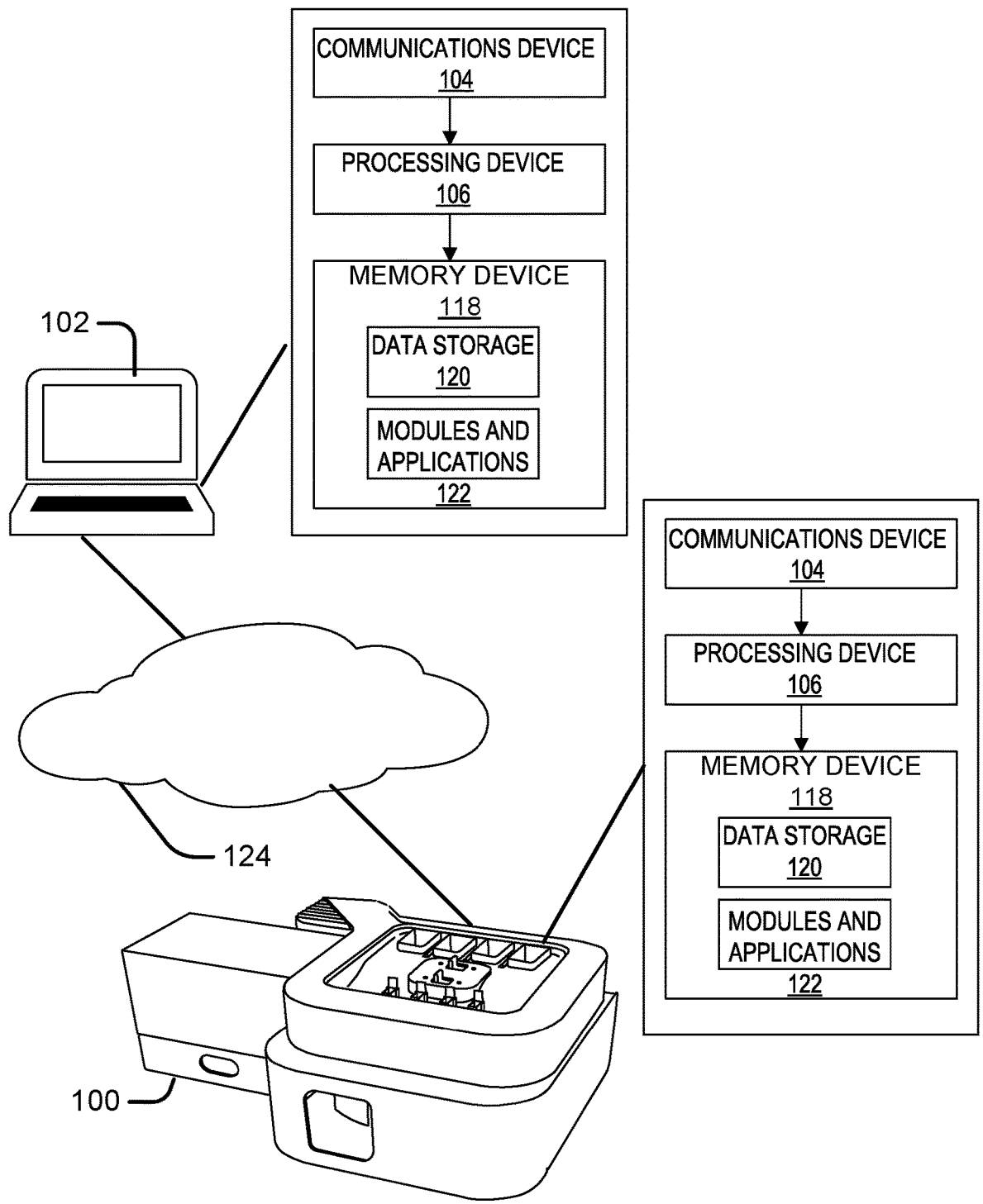
FIG. 1 illustrates an embodiment consistent with this disclosure and showing how a user accesses and interacts with a publishing system as described herein.

As described herein, a "user" is an individual who seeks to utilize, operate or perform one or more activities associated with publishing information on a digital storage unit. A preferred embodiment of an automated storage unit publishing device is illustrated in FIG. 1. A user may access such a system 100 using a computing system 102 operatively connected to the publishing system 100, to create or store media files for recording or printing on a select size and capacity casing-and-storage unit chip unit. The computing system 102 may be a typical laptop or desktop computer, equipped with a communications device 104, a processing device 106, a memory device 108 with non-transitory data storage 110, modules and applications 112. The computing system 102 may provide access to the automated publishing device 100 controller software via an application stored in the computing system memory 112 or as a software-as-a-service application accessible over the internet via the communications device 104. The automated publishing system 100 similarly comprises a computing component with a communications device 114, a processing device 116 and memory device 118 with data storage 120, modules and applications 122. An automated publishing system 100 may be provided as a standalone device, as shown in FIG. 1, or may be provided as a system of multiple devices accessible via a network. The automated publishing system 100 further comprises a number of subassemblies or subsystems equipped with microcontrollers directing the function and behavior of the subsystem in response to stored programs and sensor indications.

When the automated publishing system 100 is accessed from a computer system 102, a graphical user interface (GUI) may be generated allowing the user to configure a publishing job by inputting job parameters. The interface may be generated from computer instructions physically located 112 on the computing system or may be accessed from a remote computing system via a network or cloud 124. A typical set of job parameters may include specifying the size of a casing, the capacity of the storage unit (which may alternatively be automatically determined by the size of the content file) and the storage location for image and content files. A user may load casings and memory chips into bins. Once job parameters are set, the job will proceed and complete automatically and the user may retrieve finished units from a finished unit stack.

Figure 2A:
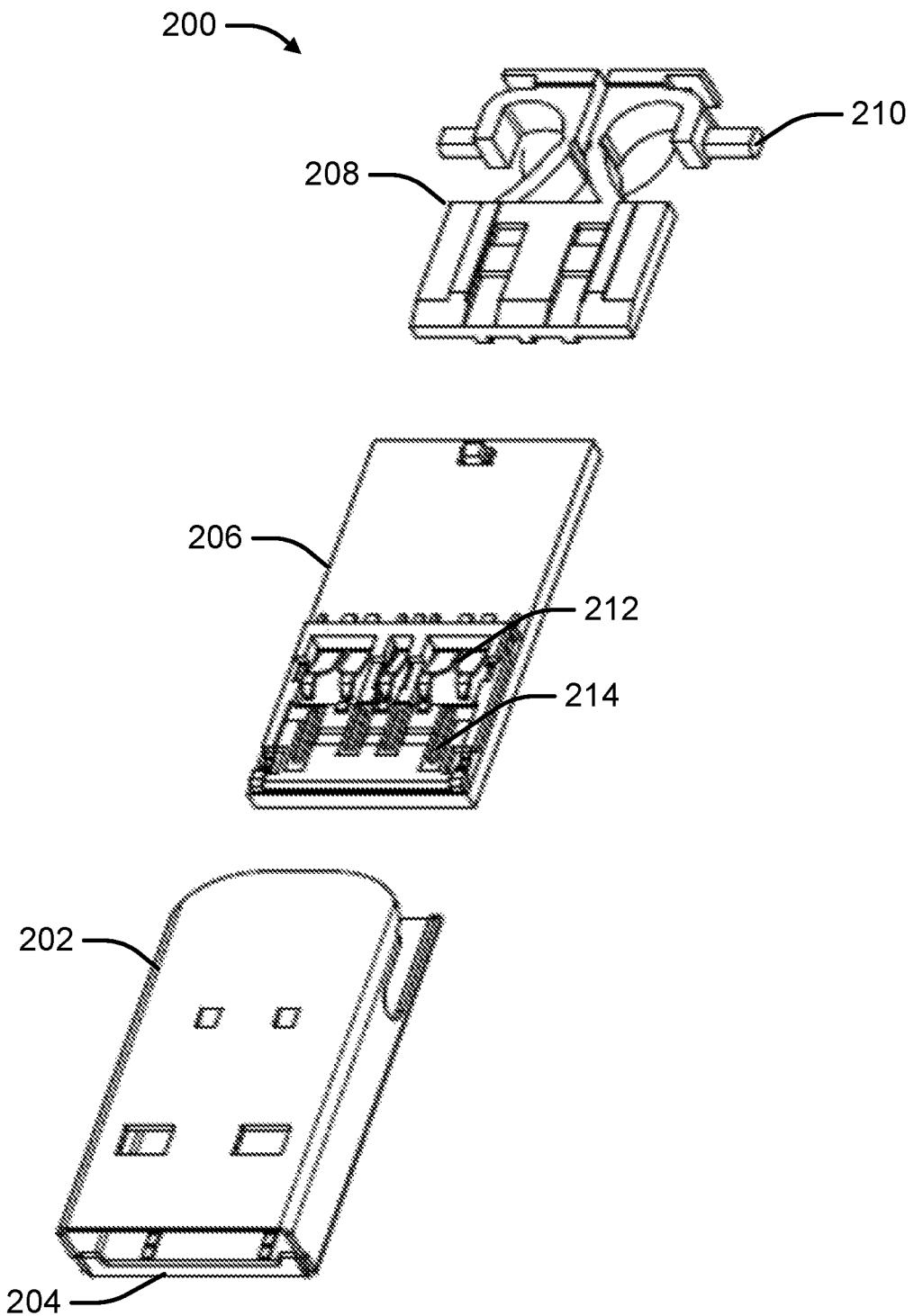
FIGS. 2a and 2b illustrate storage units capable of recording digital content and assembled to casings consistent with this disclosure.
Figure 2B:
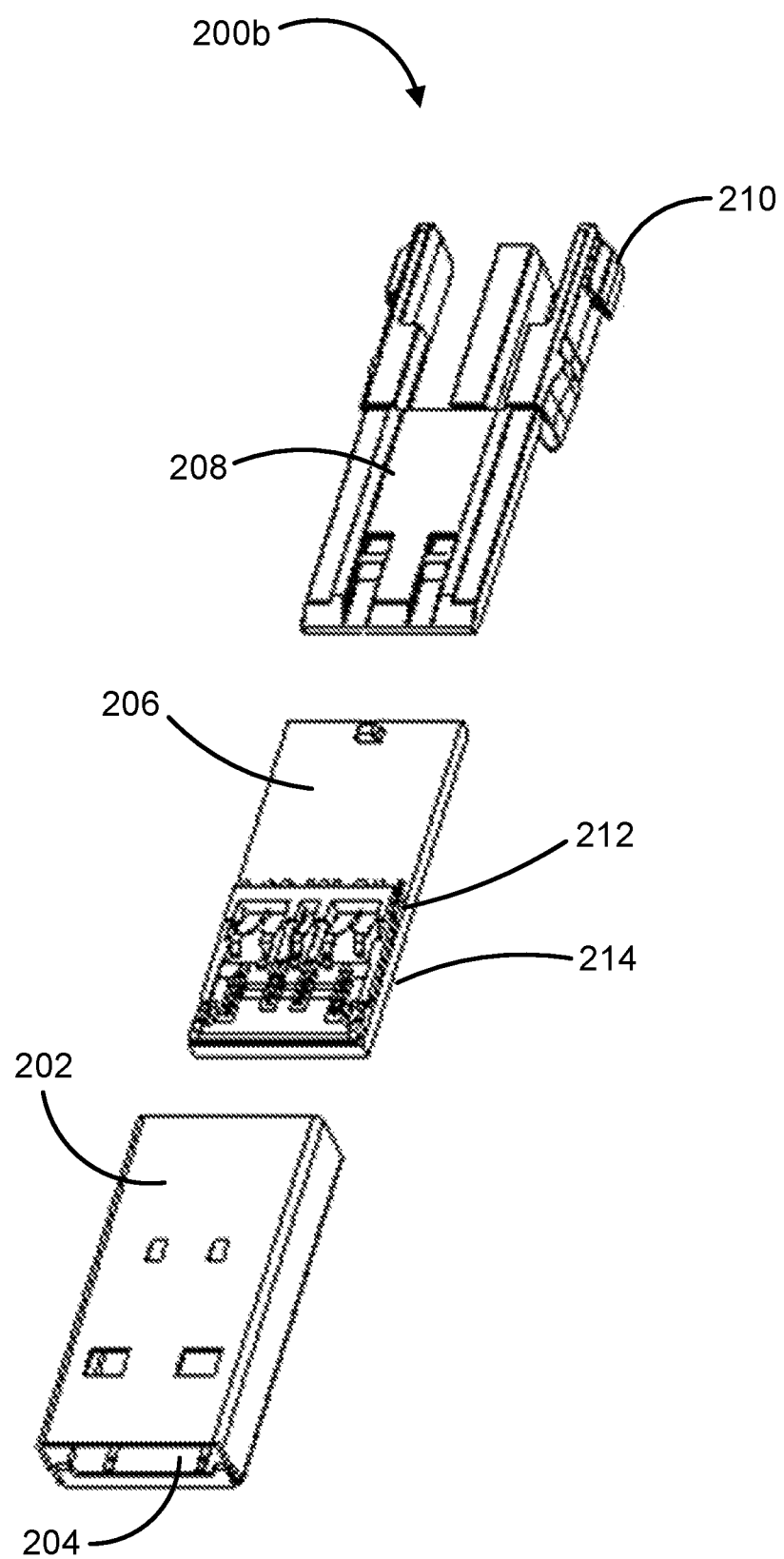

Exemplary storage units 200a and 200b are illustrated in FIGS. 2a and 2b. The exemplary units are USB3 storage units each comprised of an outer casing or enclosure 202, integrated with a USB data interface 204 that will allow the finished product to connect with a USB port on a computing system, a memory chip 206 and a flexible plastic connector 208 that provides the physical connection to the casing. The flexible connector may be comprised of tines 210 that collapse as the unit is pressed into a slot in the casing and relax and rebound to hold the unit in place when the connector is firmly inside the casing. USB3 storage unit chip standards require two sets of contacts: spring-loaded contacts 212 and stationary contacts 214.

Figures 3A, 3B:
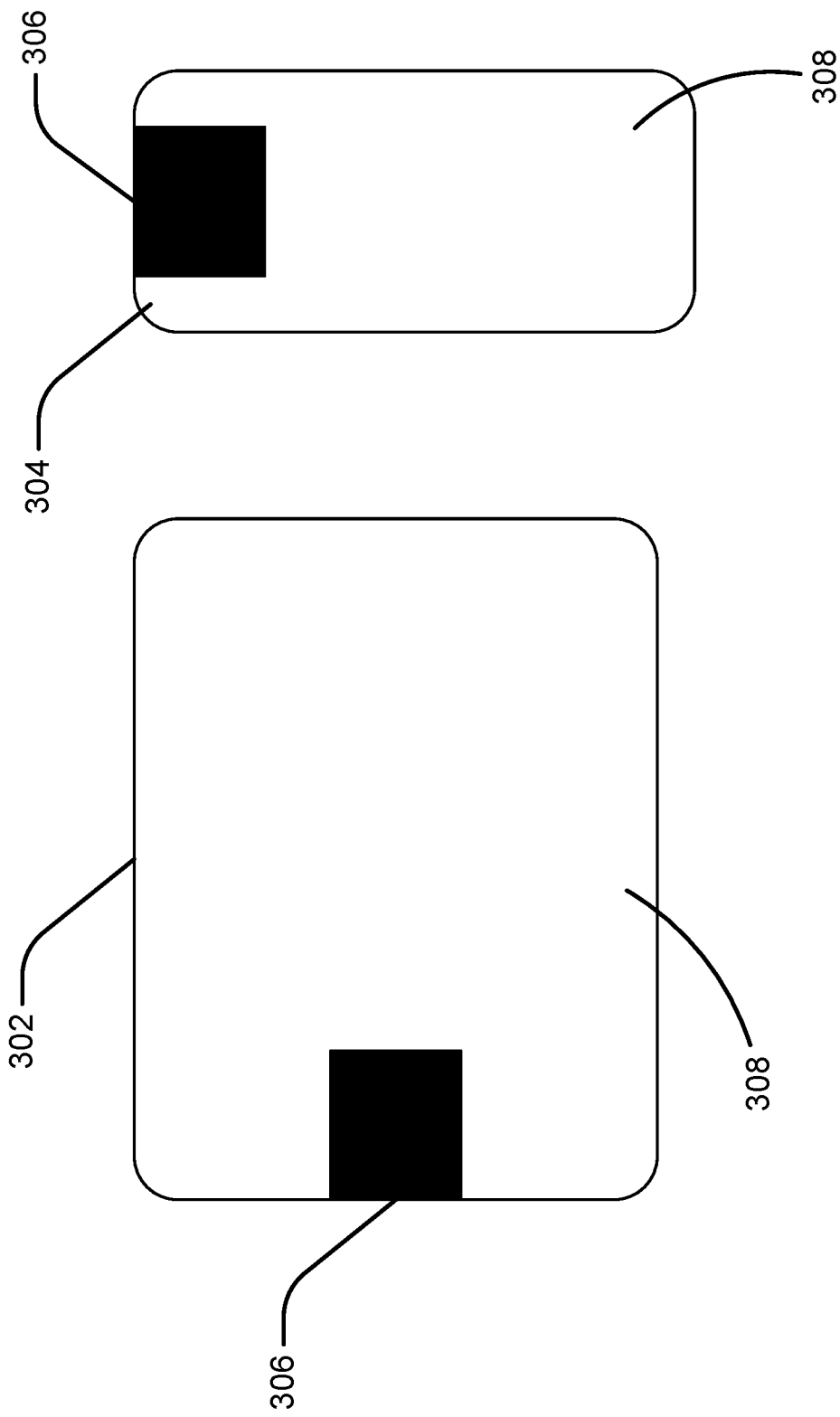
FIGS. 3a-3c illustrate exemplary casings that may be used with an automated storage unit publishing device.
Figure 3C:
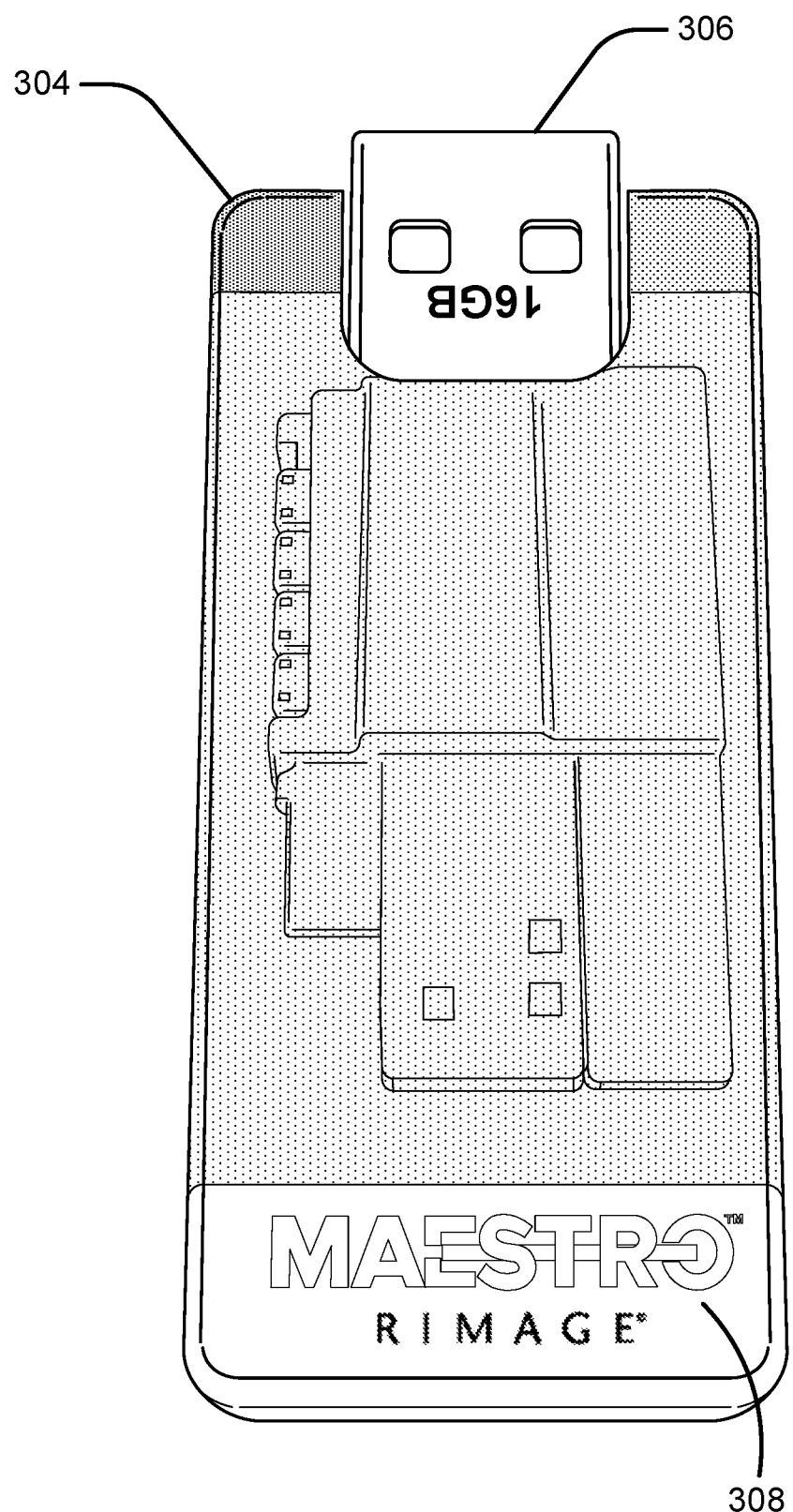

FIGS. 3a-3c illustrate exemplary large 302 and small 304 casings consistent with those that may be used with an automated storage unit publishing system 102. Casings may be manufactured from plastic, metal or other materials and may be of any size consistent with the subsystems of the publishing system. A slot 306 in the casing allows the publishing system to connect a storage unit 200a or 200b to a casing 302, 304 using a connecting device such as the flexible connector 208 depicted in FIG. 2.

An outer surface 308 of the large 302 and small 304 casings is configured to be printed upon. As described further below, the outer surface 308 can receive marks or indications such as images, text, and other indicia. Other examples include logos, pictures, and/or an index of the material stored on the memory chip within the casing. The outer surface 308 of the small 304 casing of FIG. 3c has example marks and indications printed thereon.

In some examples, transferring of the marks or indications to the surface 308 can be done using techniques including: a thermal retransfer printer including a thermal ink ribbon, a clear retransfer film, a thermal print head to print image to the retransfer ribbon, and a heating roller to transfer the printed image to substrate; an inkjet printer including cartridges of ink that are dispensed on the surface to transfer the image to the substrate; and/or a direct thermal printer consisting of thermal ink ribbon, a thermal print heat to print image directly on the substrate, that is printed on the outer surface 308. One non-limiting example of such a printing process is described in U.S. Pat. No. 6,827,509 to Suden, the entirety of which is hereby incorporated by reference.

One or more files including the marks or indicia for printing on the outer surface 308 is downloaded through the network 124 and stored on the data storage 120. As described further below, modules and applications 122 are programmed to access the marks or indicia in the files on the data storage 120 to print the marks or indicia on the outer surface 308.

Figure 4:
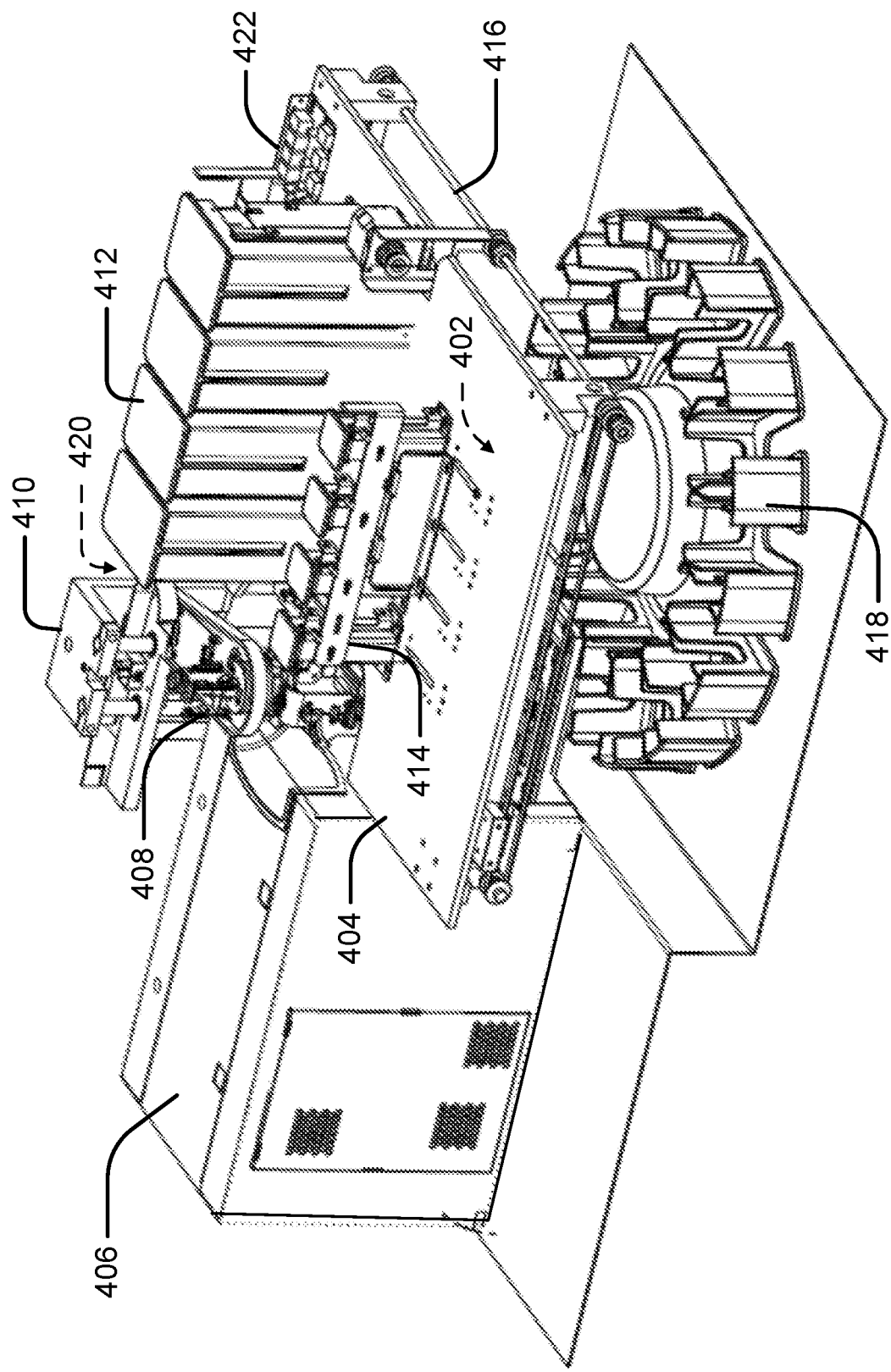
FIG. 4 is an exploded view of an exemplary automated storage unit publishing device consistent with this disclosure.

FIG. 4 illustrates an exploded view of a multi-component system consistent with this disclosure. A housing unit (illustrated in FIG. 1) 102, comprises a recording device 402 (illustrated more clearly in FIG. 6, but obscured from view by the plate in FIG. 4), located on the underside of an assembler plate 404, a printer 406, a robotic gripping device 408 with a lift mechanism 410 and robotic controller printed circuit board assembly (PCBA) 420 (illustrated more clearly in FIG. 8) and signal monitor PCBA 422, multiple bins designed to hold an assortment of casing sizes 412 and content storage units 414 of varying storage capacities, and an assembler subassembly or assembler, movably attached to a carriage assembly 416, also located on the underside of the plate and seen more clearly in FIGS. 5b and 7. Finished units are dropped into finished product bins arranged, in some embodiments, in a carousel 418 and may be removed manually. Such a system may perform a variety of concurrent or sequential workflows which will be discussed further below.

Figure 5:
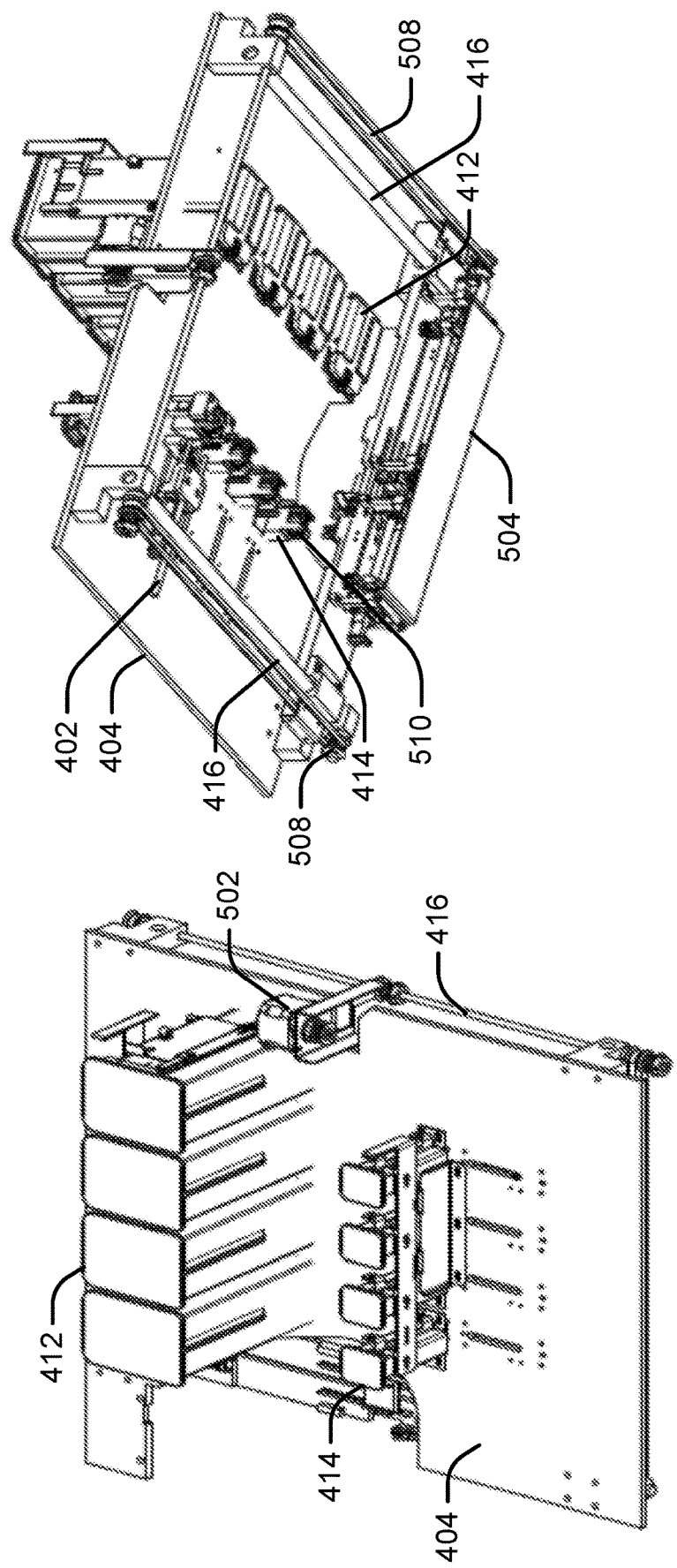
FIGS. 5a and 5b illustrate upper and underside views of a mounting plate comprising case and storage unit bins, recording units and assembler unit and carriage subsystem.

FIG. 5 illustrates a top (5a) and bottom (5b) view of the assembler plate 404 comprising a casing input bin 412 and storage unit input bin 414. An assembler 504 motor 502 may be located on the upper side of the assembler plate 404. An assembler 504 may be moveably connected to a carriage assembly comprising of two parallel shafts 416 located on either side of the plate's underside and two assembler belts 508, each adjacent to a shaft 416, allowing the assembler to slide along the shafts 416, aligning the assembler 504 under selected card 412 and storage unit 414 bins for assembly. The bottom of the card 412 and storage unit bins 414 protrude into the assembler plate 404 underside for accessibility by the assembler 504 and recorder 402. A lifter block 510 may be mounted to the bottom of the storage unit bin 414.

Figure 6:
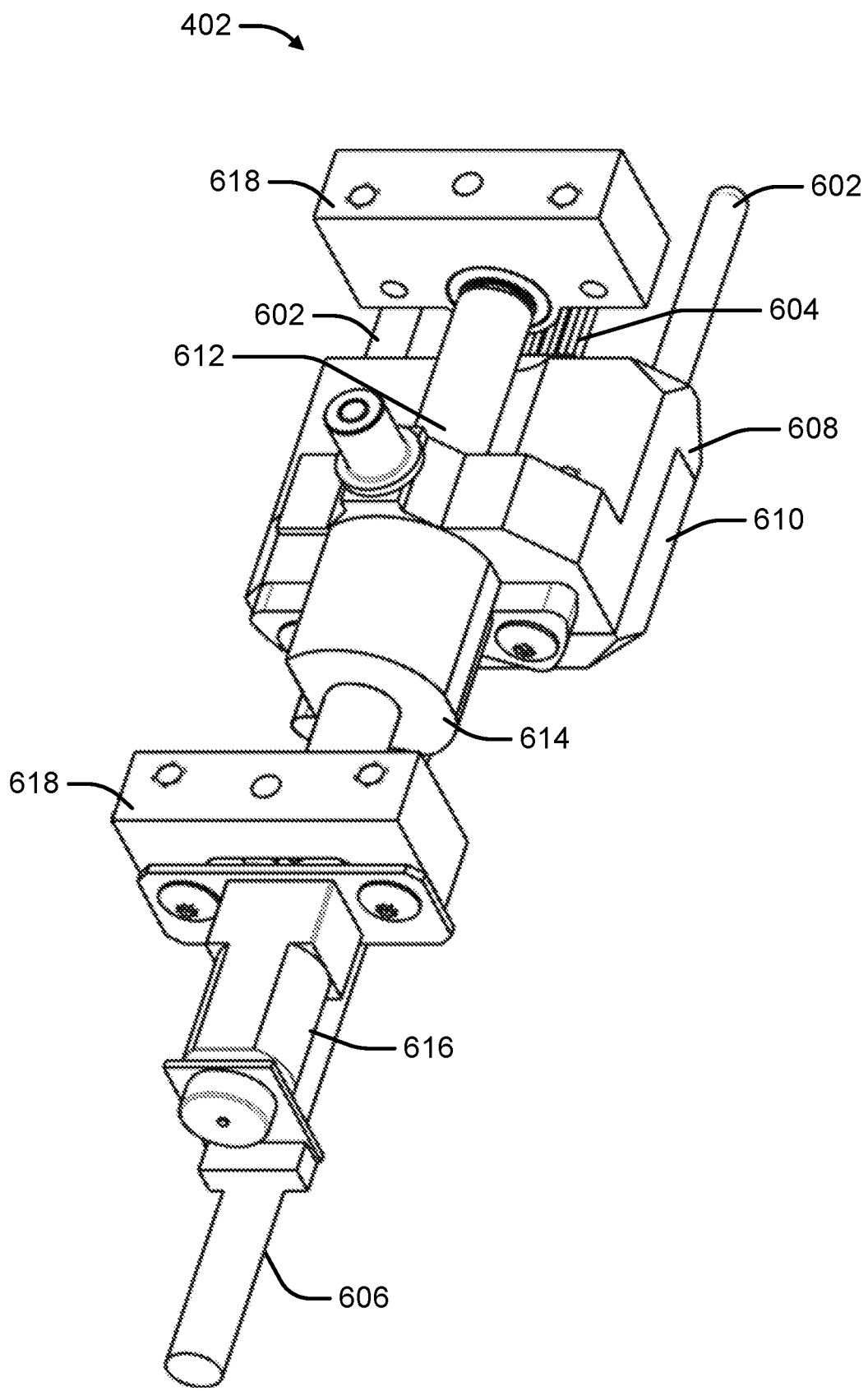
FIG. 6 illustrates an exemplary recording device for recording digital content on a flash memory chip consistent with this disclosure.

FIG. 6 illustrates an exemplary recording device for recording digital content on a storage unit memory chip 206. A publishing system 102 consistent with this disclosure may comprise a set of recording devices 402 mounted in front of each storage unit bin 414. Some embodiments may have a recording device 402 that slides from bin to bin along a carriage assembly, according to a job workflow selected and configured by the user. A preferred embodiment may be designed with a recorder 402 mounted in front of each storage unit bin 414. The recording device 402 may comprise a set of guide pins 602 and a tongue 604 with connectors that may be inserted into the data interface 204 of the storage unit, and which are operatively connected to a data cable 606; upper 608 and lower 610 guide plates; a leadscrew 612, leadscrew nut 614, motor 616 and bearing blocks 618 allowing translational motion. A recording device 402 mounted in front of a storage unit bin 414 is driven forward by a motor 616 and leadscrew 612 to connect with the lowest storage unit in the bin 414 stack. A tongue 604 and data cable 606 is held in a fixed position by upper 608 and lower plates 610. When the tongue 604 connects with the storage unit contacts 212, 214 and is in position for recording, the tongue 604 sends a signal via the data cable 606, indicating that the recorder 402 is in position for recording and recording may begin. The tongue 604 may be replaced by other signal monitoring devices or adapted or reconfigured according to the type of data interface on the storage unit.

FIG. 7 illustrate the top (7a) and underside (7b) of an exemplary assembler subassembly 504. An assembler 504 may be attached to a carriage assembly (416, 508) and allowed to move horizontally forward and back parallel to case 412 and storage unit 414 bins. An assembler controller 702 may direct the assembler 504 in response to sensor indications. Case size sensors 704 are used to determine the size of the case on the case lifter 716. Case bin position sensors 726 are used to determine case bin positions. Storage unit bin positions sensor 728 are used to determine storage unit bin positions. A case bin access area 706 and storage unit bin access area 708 on the assembler 504 may align with the bottom of the case bin 412 and storage unit bin 414, respectively. A large casing may fit within the assembly area rails 710. Smaller casings may require case guides 712 to position the small casing for assembly. Case guides 712 may move as the assembler 504 senses the size of the casing. A motorized 714 case lifter 716 may be provided to allow a gripper (discussed below) access to remove small casings. Shuttles 718, 720 located on the assembler behind the bin access areas 706 and 708 push recorded media and empty casings from their stacks to the assembly area. The shuttles 718, 720 may compress the storage unit 200a or 200b into the slot on the casing 306. Flexible tines 210 on a flexible retainer 208 bend to allow the storage unit 200a or 200b to connect with the casing 302, 304. Once inside the casing slot 306, the tines 210 relax and expand to their normal configuration, securing the storage unit to the casing. FIG. 7b illustrates the underside of the assembler 504, where shuttle leadscrews 722 and leadscrew motors 724 may be located.

Figure 8:
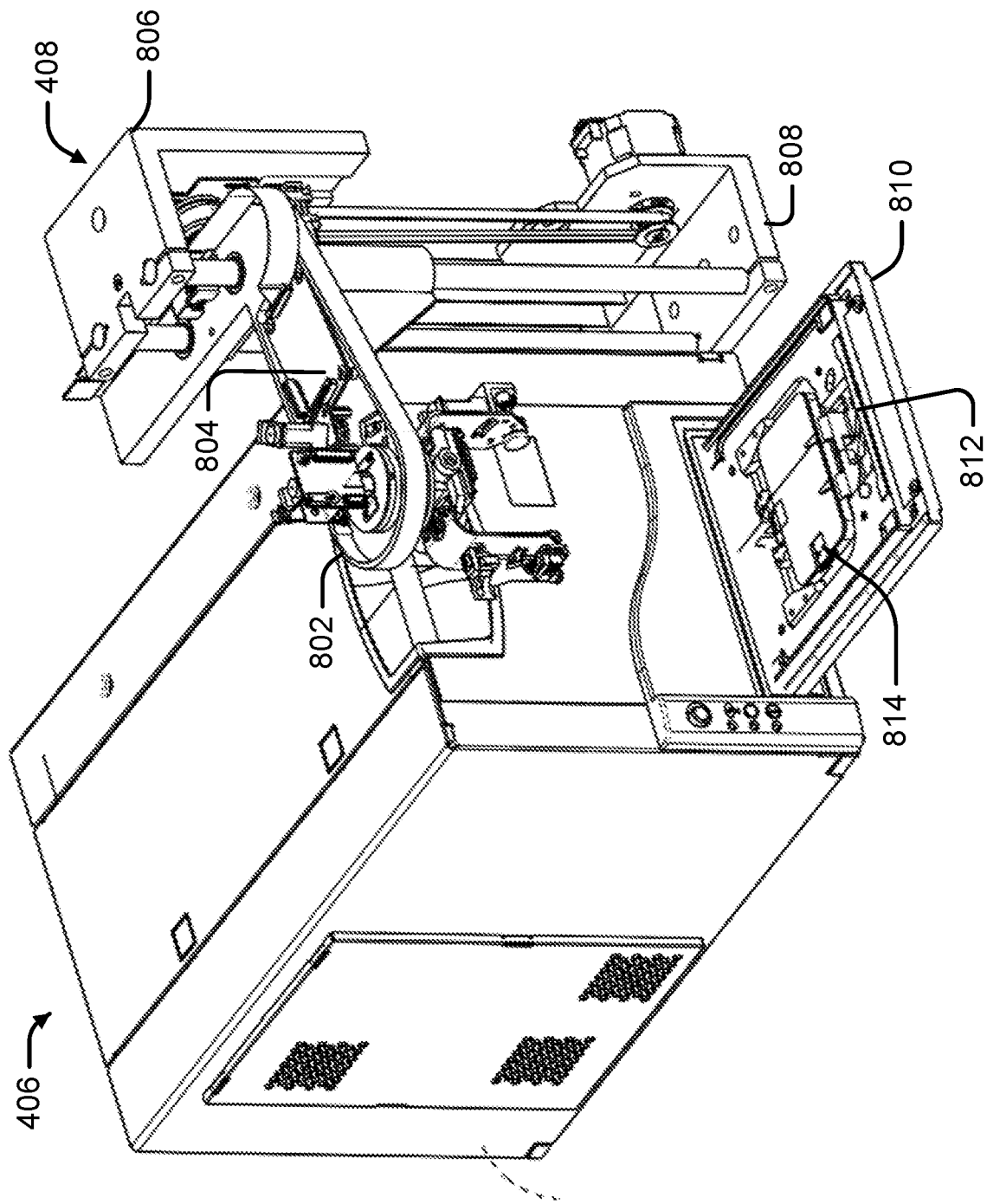
FIG. 8 illustrates and exemplary printing device and gripper mechanism with lift consistent with this disclosure.

FIG. 8 illustrates an exemplary printer component 406 consistent with this disclosure. A preferred embodiment may use a thermal printer or any other kind of printer. In a preferred embodiment the printer 406 prints an image on a retransfer sheet. The image printed on the retransfer sheet may be a single side or a double-sided image. A gripper 802 may be used to place and/or remove casings to/from the printer tray 810. A lift mechanism 806, 808 allows the gripper 802 to move vertically along a shaft under the control of a computer processor 420. A printer tray 810 may be opened to load a casing and closed to print the image file on the casing under the control of a computer processor. The tray 810 may be designed to hold casings of multiple sizes. In some embodiments, a tray has a rectangular seat 814 and clamp fingers 812 for holding the casing in place. Casings may be loaded into the tray by the gripper 802 in a semi-precise location, and clamp fingers 812 hold the casing in place to allow the printed image to align with the casing.

Figure 9:
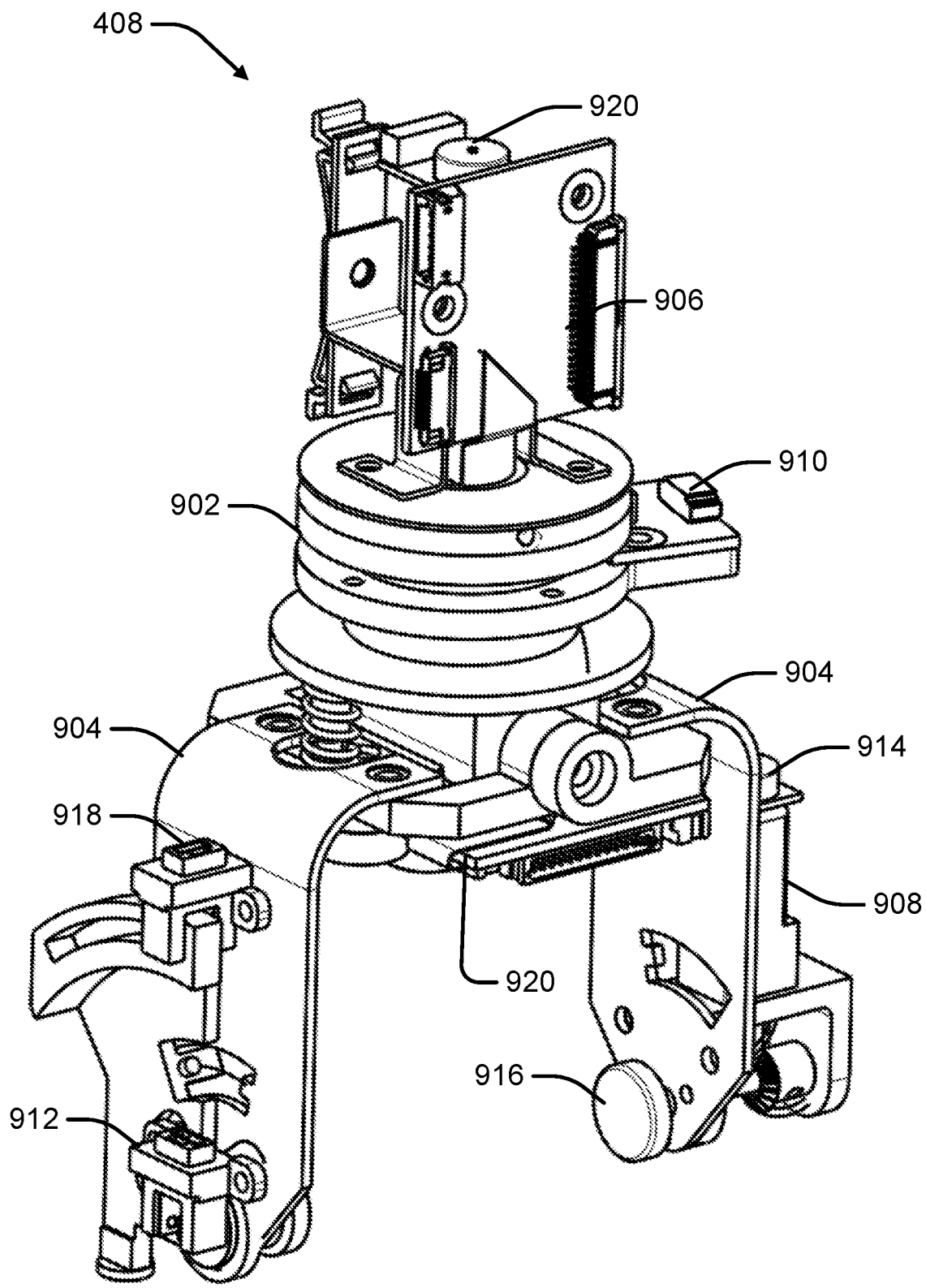
FIG. 9 illustrates an exemplary gripper device of FIG. 8.
Figure 10:
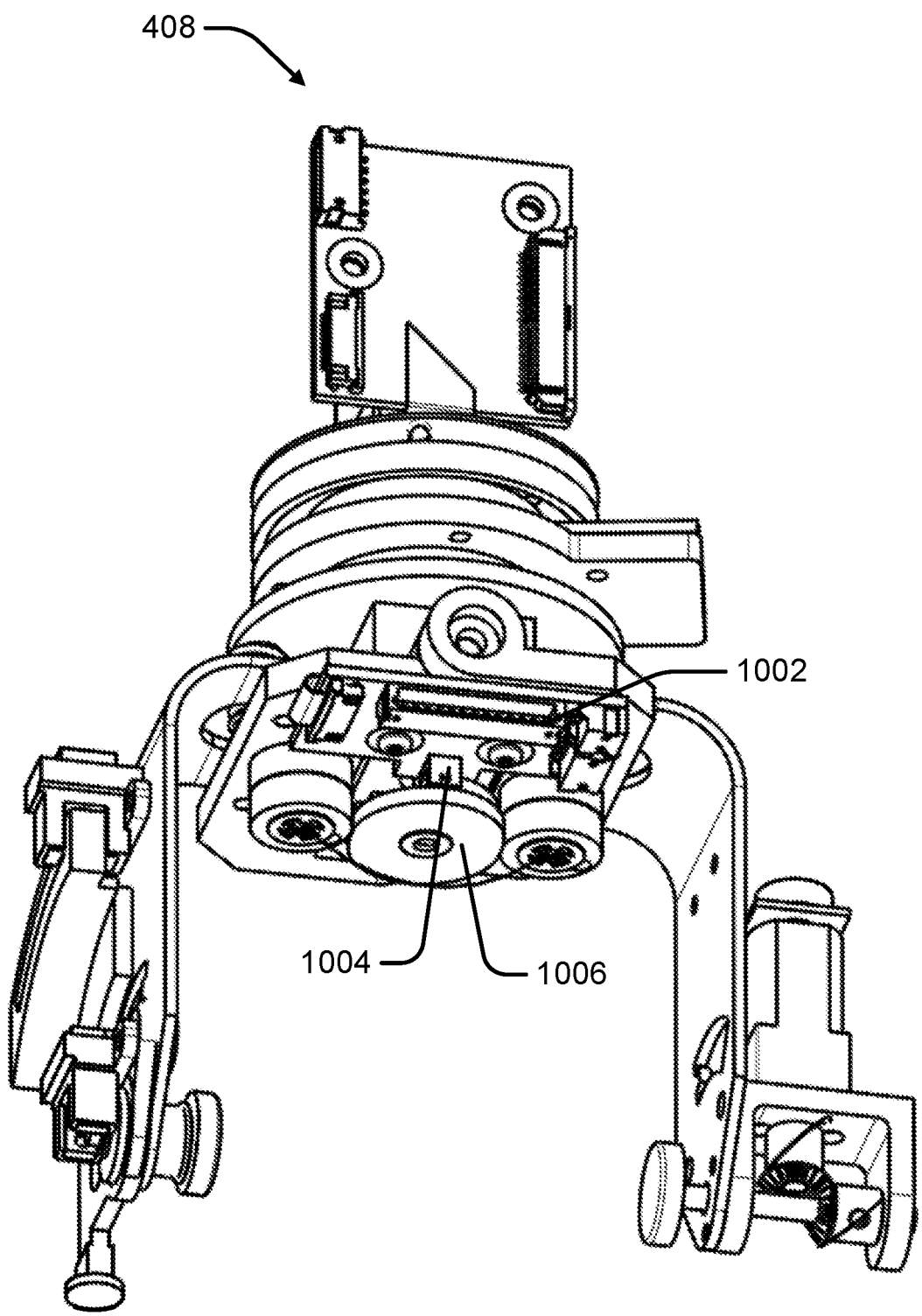
FIG. 10 provides an additional view of an exemplary gripping device.

FIGS. 9 and 10 illustrate an exemplary robotic gripping mechanism (gripper) consistent with the one illustrated in FIG. 8. The primary function of the gripping mechanism 408 is to facilitate movement of the assembled case-and-storage unit to and from the printer tray, to flip the casing to the second side following printing of the first side, and to carry the finished, printed product to a finished product bin 418, using vertical movements from the lift 410, rotation from the wrist 902, and outward movements of the arms, or claws 904. The gripper illustrated in FIGS. 9 and 10 is comprised of one microcontroller and a number of motors and sensors that drive the gripper to perform its functions. PCBA (Printed Circuit Board Assembly) A 804 receives information from clamp 1004, rotation 910 and case present 912 sensors to guide gripper functions and controls and activates a casing rotate motor 908. A casing present sensor 912 provides the controller with an indication of whether a card is in the claw (arms) 904, or if it has been picked up but fallen off the grip 904. PCBA B 906 provides a tie point for the dynamic cables that move with the gripper 408. Cables are highly flexible and run between PCBA A 804 and PCBA B 906. Both arms 904 move with the cable as the wrist rotates, but do not flex in any direction. Casings are gripped with a flip pad 916 or similar element, allowing it to flip the casing from one side to another. Arms 904, or claws, move outward and rotate. The claw motor 920 drives the cam 1006 to spread the arms apart 904 (see FIG. 10). A tray present sensor 918 informs the gripper controller of the presence or absence of the printer tray 810, specifically, the precise vertical location of the printer tray and indicating when the case and storage unit may be loaded into the tray 810. Referring to FIG. 10, PCBA C 1002 facilitates the functionality of the clamp sensor 1004 for the gripper arms.

Figure 11A:
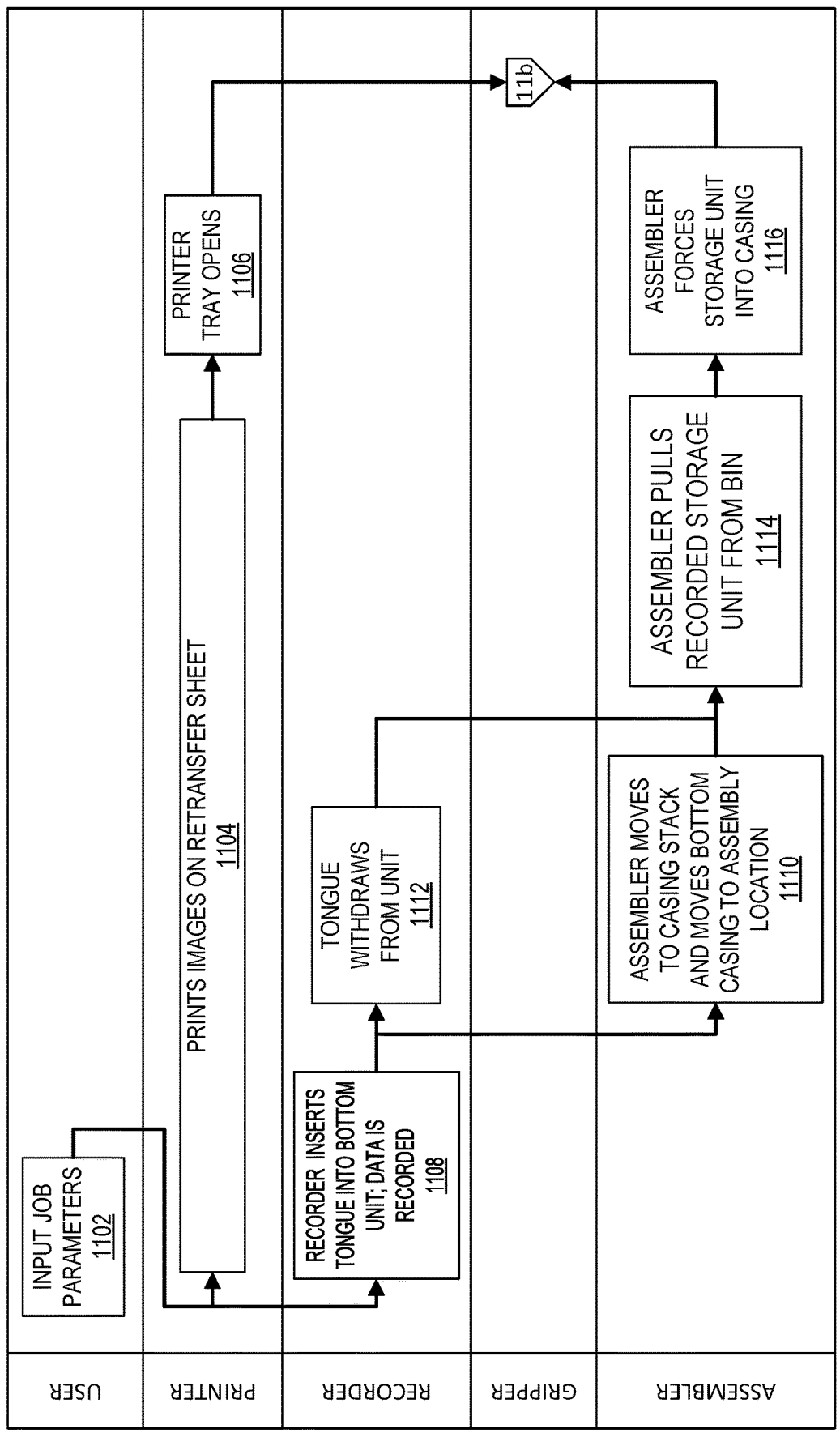
FIGS. 11a and 11b provide a flow chart describing a method of using an automated storage unit publishing device consistent with this disclosure.

A method of using an embodiment of an automated storage unit publishing system is described by the flowchart of FIG. 11a. Some embodiments may require very different configurations of the subassemblies in order to coordinate different workflows. Coordination of the processes involved in using the automated publishing system 100 may vary from those described here and therefore the series of steps may also vary. In one embodiment, a user may access 1102 the automated publishing machine 100 via a computing system 102. A graphical user interface 102 for a controlling software application running on a computing system and operatively connected to an automated publishing system 100 allows the user to create specifications for a job, including the number of storage units, type of casing, storage unit capacity, and the name and location of image and digital content files to be printed or recorded on the casing-storage unit assembled unit. In some embodiments, the user may specify multiple casing and storage capacity combinations and assign different image and content files to each combination. When the job begins 1104, a printer 406 prints a front and back image to a retransfer sheet. The printer tray 810 opens 1106 when it is ready to receive and print an image on a casing-storage unit. Concurrent with printing the image on the retransfer sheet 1104, a recording device 402, positioned in front of the selected storage unit media bin 414, moves forward 1108. As the tongue 604 and leadscrew 620 move the assembly forward, storage unit lifter pins 602 engage with lifter blocks 510 mounted to the underside of the storage unit bin stack 414. The lifter block 510 may comprise a ramp serving to lift the recording device 402 to allow the tongue 604 to align properly with the storage unit and provide the lowest level that the storage unit will sit in the bin 414. As the recorder 402 progresses forward the leading edge of the pin 602 will drive down the ramp, lifting the two blocks up and aligning tongue 604 to the storage unit 200a or 200b inside the bin 414 by lifting the lifter blocks 510, raising the storage unit 200a or 200b up and pushing the stack up to get the bottom storage unit aligned with the tongue 604. The tongue 604 is operatively connected to a data cable 606 to receive a signal when the tongue connects with the storage unit chip connectors 212, 214. If a signal is not received or is received but indicates that the storage unit 200a or 200b is defective, a message will be sent to the printer 406 indicating that the unit is bad and the printer 406 will print an additional label for that unit in order to label it as defective.

Figure 12A:
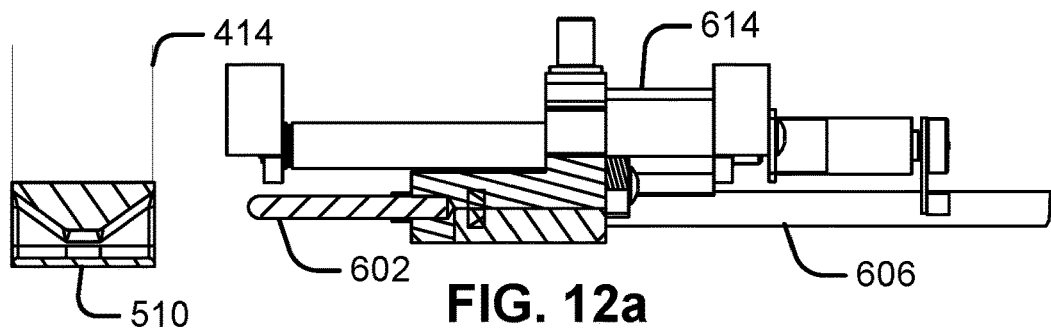
FIGS. 12a-12d provide incremental views of the process of aligning the recorder with a storage unit at the base of a storage unit bin.
Figure 12B:
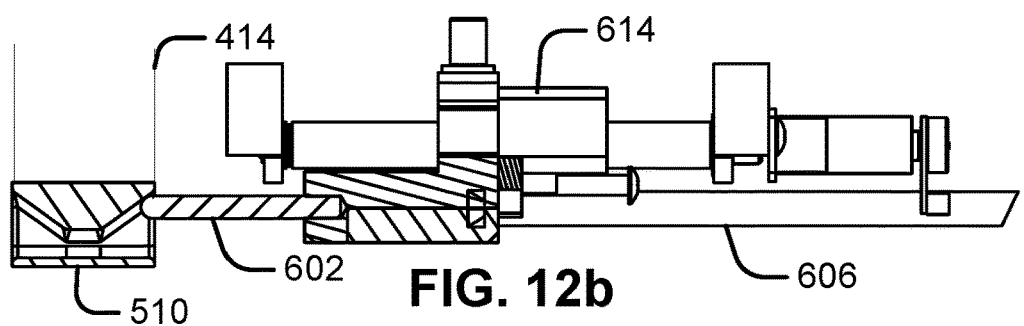
Figure 12C:
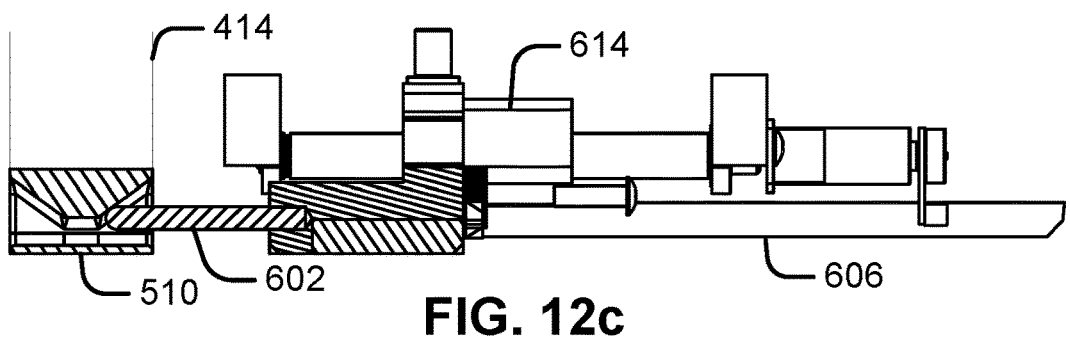
Figure 12D:
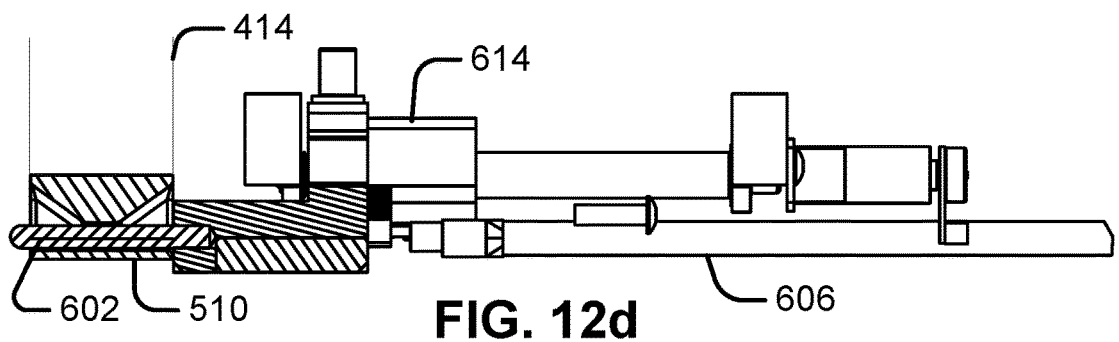
Figure 12E:
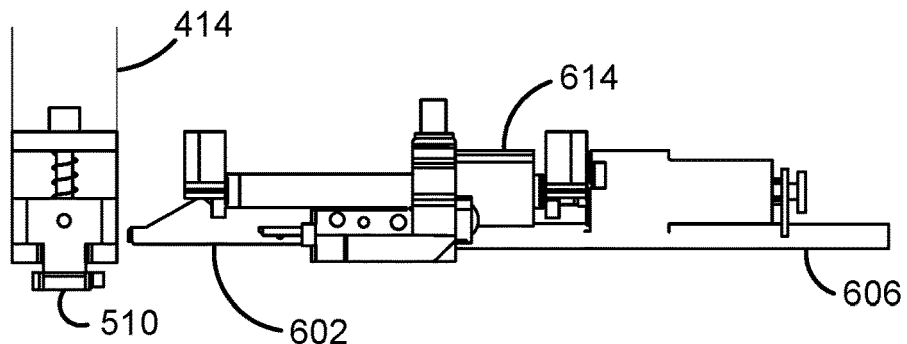
FIGS. 12e-12h provide alternative incremental views of the process of aligning the recorder with a storage unit at the base of a storage unit bin.
Figure 12F:
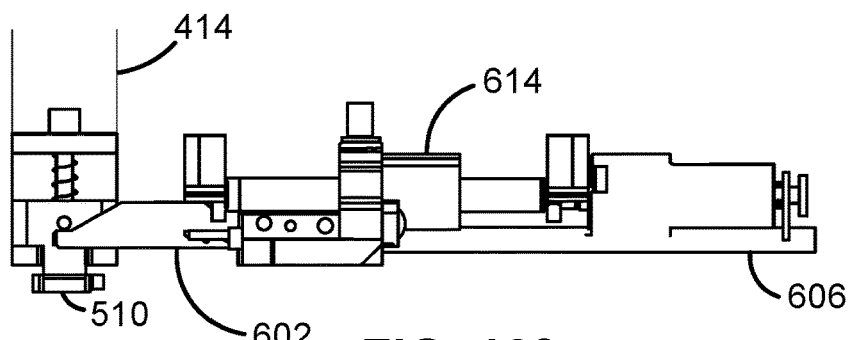
Figure 12G:
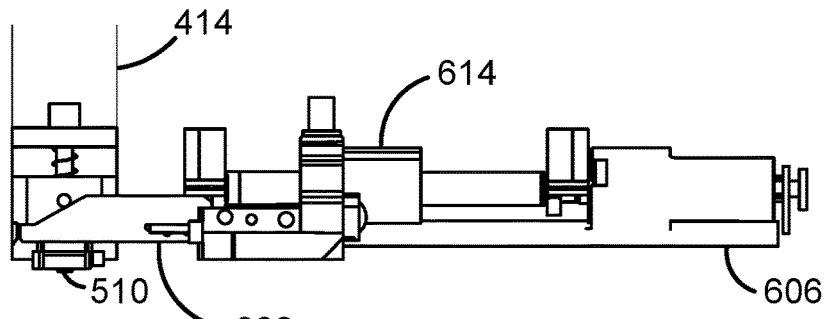
Figure 12H:
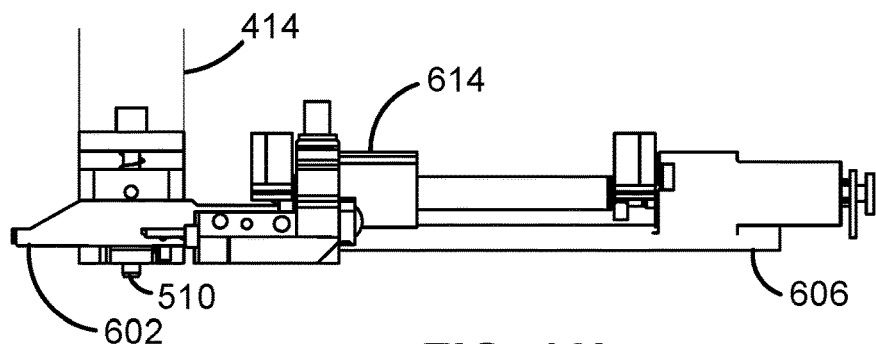
Figure 13A:
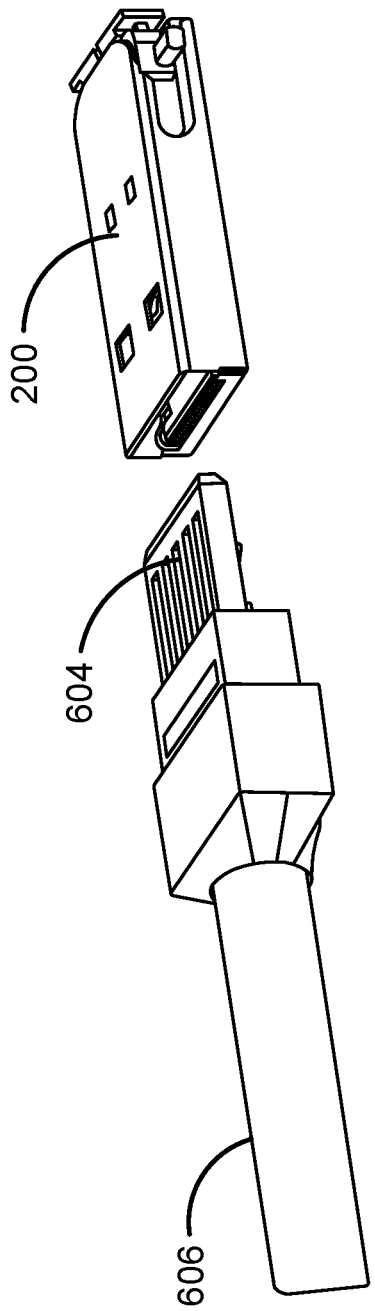
FIGS. 13a and 13b provide greater detail of the connection between a recorder tongue and the storage unit.
Figure 13B:
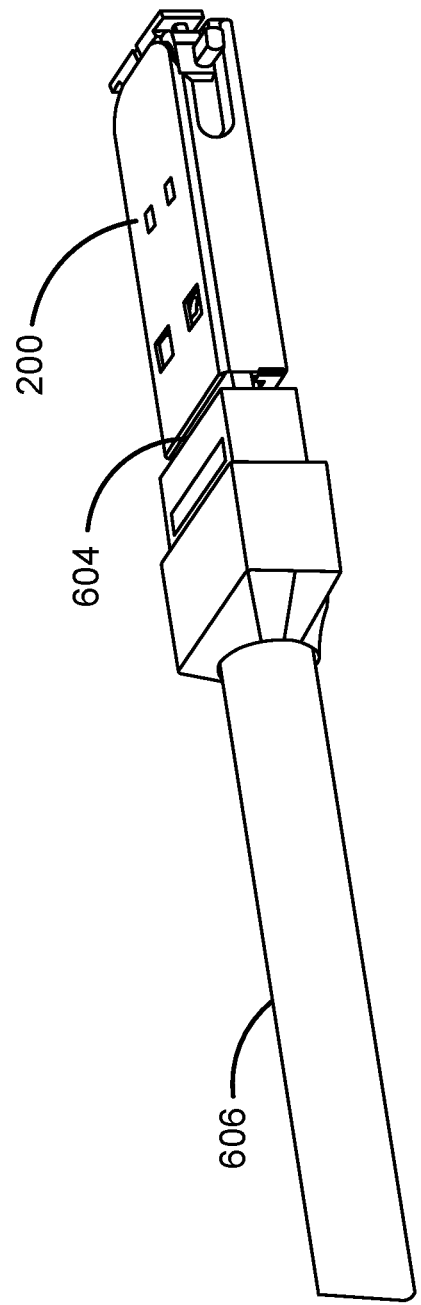

Referring now to FIGS. 12a-12d and 12e-12h which illustrate alternative processes of inserting the recorder into the bottom-most storage unit for recording consistent with a preferred embodiment. As the recorder 402 is translated forward (FIGS. 12a and 12e) toward the bottom of the storage unit bin 414, recorder pins 602 engage with a lifter block 510 mounted at the bottom of a storage unit bin 414 (FIGS. 12b and 12f). The recorder pins 602 engage with the top section of a ramp inside the block (FIGS. 12c and 12g), forcing the storage unit stack inside of a storage unit bin 414 up to align with, and insert into, the storage unit (FIGS. 12d and 12h). A robotic controller PCBA 420, and signal monitor PCBA 422 monitor signals on the data cable 606, to determine when the tongue is fully inserted so that recording may begin. FIGS. 13a and 13b illustrate the connection formed by the tongue 604 and storage unit 200a or 200b.

Standard storage unit memory chips like the one illustrated here 206 have spring-loaded 212 contacts and stationary 214 contacts. The connections on a device inserted into the storage unit, such as the tongue 604 described here, are the inverse of those on the storage unit chip, with spring-loaded contacts and stationary contacts opposite the storage unit's stationary and spring-loaded contacts, respectively. Contacts must line up in three dimensions. In some embodiments, the system may monitor all connections to determine that a complete connection has been made. With a preferred embodiment, the system may monitor the two outer spring-loaded 212 contacts on the chip. When those contacts are made, a signal may be sent to the controller indicating that the recorder 402 is near alignment. A value may be set in the controller to allow the recorder 402 to travel an additional distance to account for variability in the mechanical and electrical properties associated with the recording device.

Referring back to FIG. 11a, the assembler 504 moves to, and positions below the selected casing stack 1110. Sensors indicate that the size of the case is correct and the bottom card is pulled to the case bin assembly area 706. Once the content file has been recorded on the storage unit 200a or 200b, the tongue withdraws 1112 from the storage unit 200a or 200b. The assembler moves to, and is positioned below, the bin 414 of the recorded storage unit. The recorded storage unit is pulled 1114 onto the storage unit bin assembly area 704. Assembler 504 and storage unit shuttles 718, 720 move the case and storage unit 1116 from their respective access areas and push the recorded storage unit into the case slot 306. As was illustrated in FIGS. 2a and 2b and discussed above, a storage unit retainer may comprise flexible tines 210 which may bend as it is forced into the case slot. Once inside the case slot, the tines relax and the storage unit is securely fixed to the case.

Figure 11B:
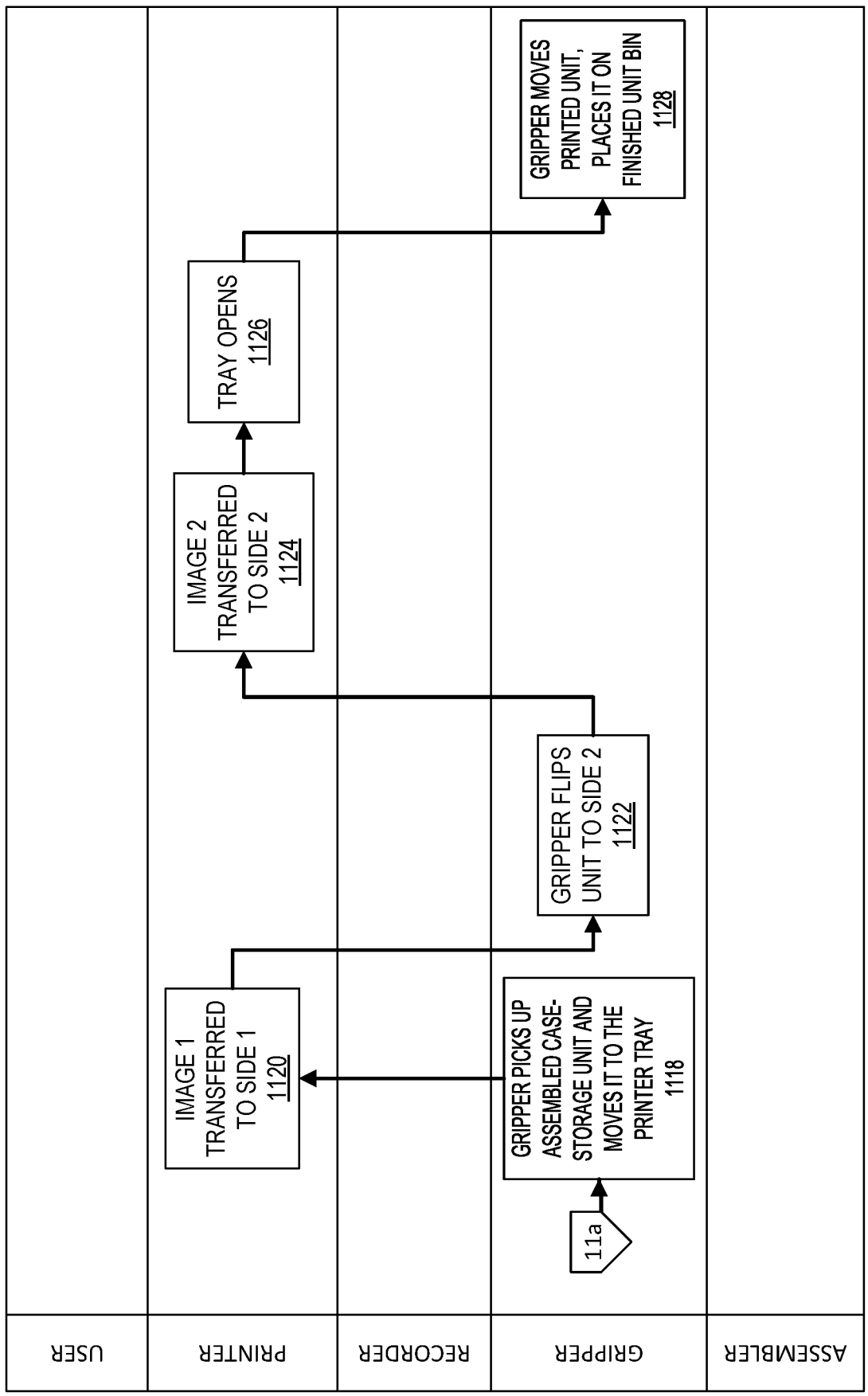

An assembled casing-storage unit may be picked up 1118 by a gripper 408 and moved to the open printer tray 810 seat 814, where it is secured in place for printing. Small casings 304 may not have sufficient clearance on the assembler 504 and may require the case lift 716 described in FIG. 7 to elevate the casing in order to allow adequate clearance for the gripper 408 to pick up the assembled case and storage unit. The gripper 408 moves on the lift 410, the gripper motor 920 spreads the arms apart, picks the card off the assembler with flip pads 916 and puts it in the seat 814 of the printer tray 810 where it is secured to the tray seat with grips 812. Referring now to FIG. 11b, the tray 810 closes and the printer transfers 1120 the first image to the case and storage unit. When the first side has been printed, the printer tray 810 opens and the gripper 408 picks the card off the printer 406, rises up a few inches, allowing space to turn it over, flips the unit 1122 and puts it back down on the printer tray seat 814 where it is secured to allow retransfer of the second side 1124. There are many types of gripping effectors available. For example, grippers may be equipped with vacuum cups or claw- or pincer-type effectors that can pick up and move objects; others may have finger-like gripping surfaces that can be machined to contours that fit precisely around a specific object, such as a storage unit casing, others may use electro-magnets to attract magnetic material in the storage unit and/or casing. When the second side of the case and storage unit has been printed, the tray 810 opens 1126 to release the finished product. The gripper moves 1128 the finished product to finished product bins 418. Users may manually retrieve the finished units from the output bins 418.

Figure 14:
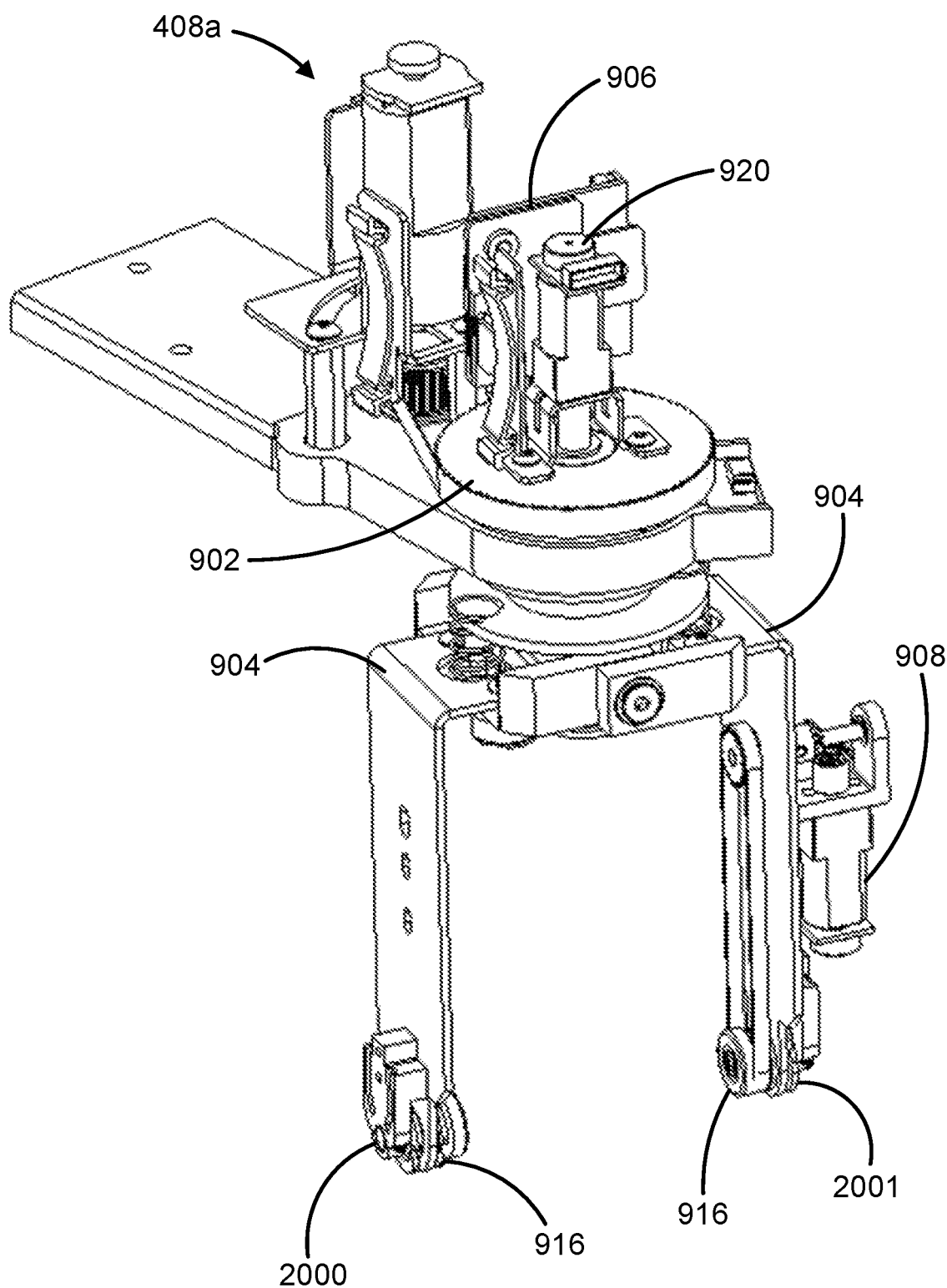
FIG. 14 illustrates an alternative exemplary gripper device.
Figure 15:
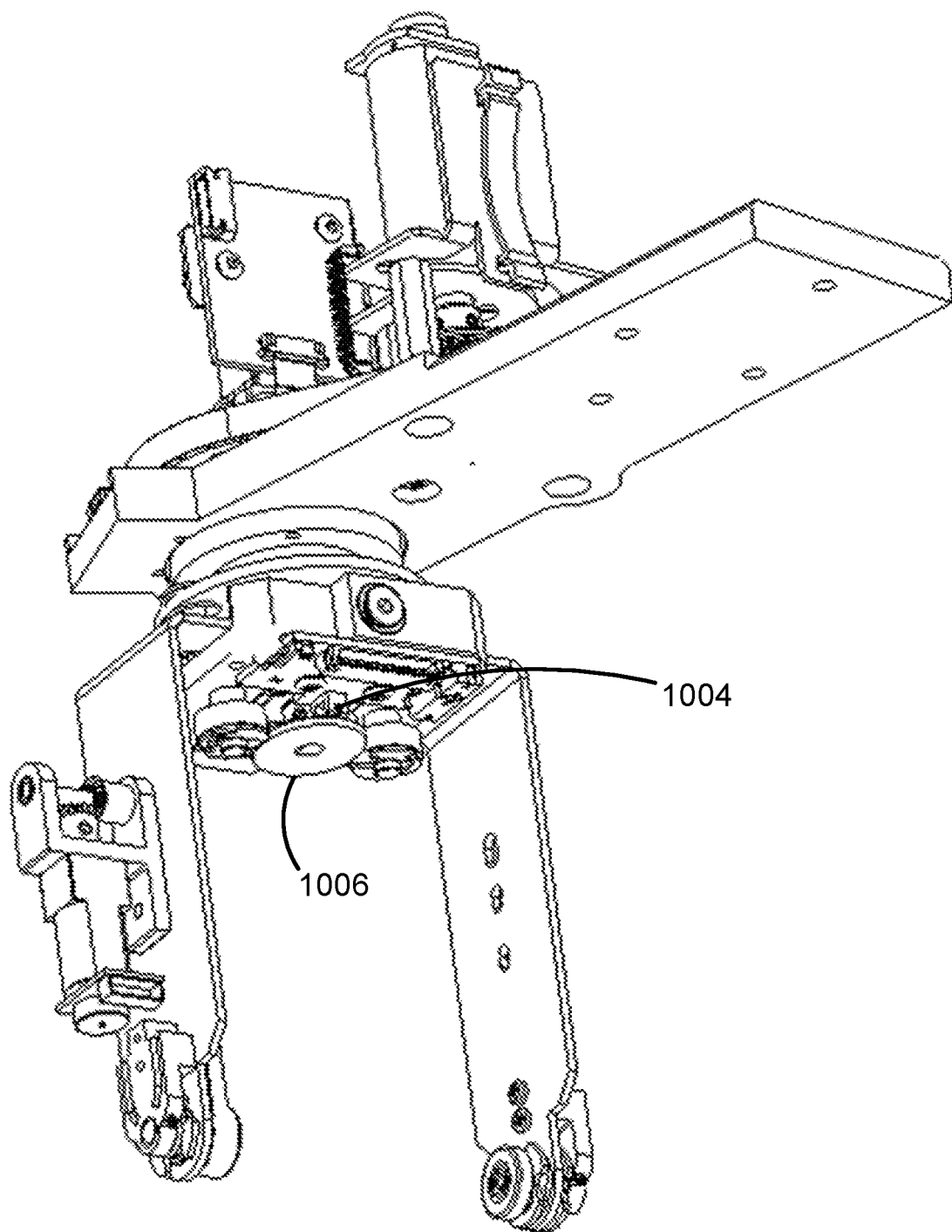
FIG. 15 provides an additional view of an exemplary gripping device of FIG. 14.
Figure 16:
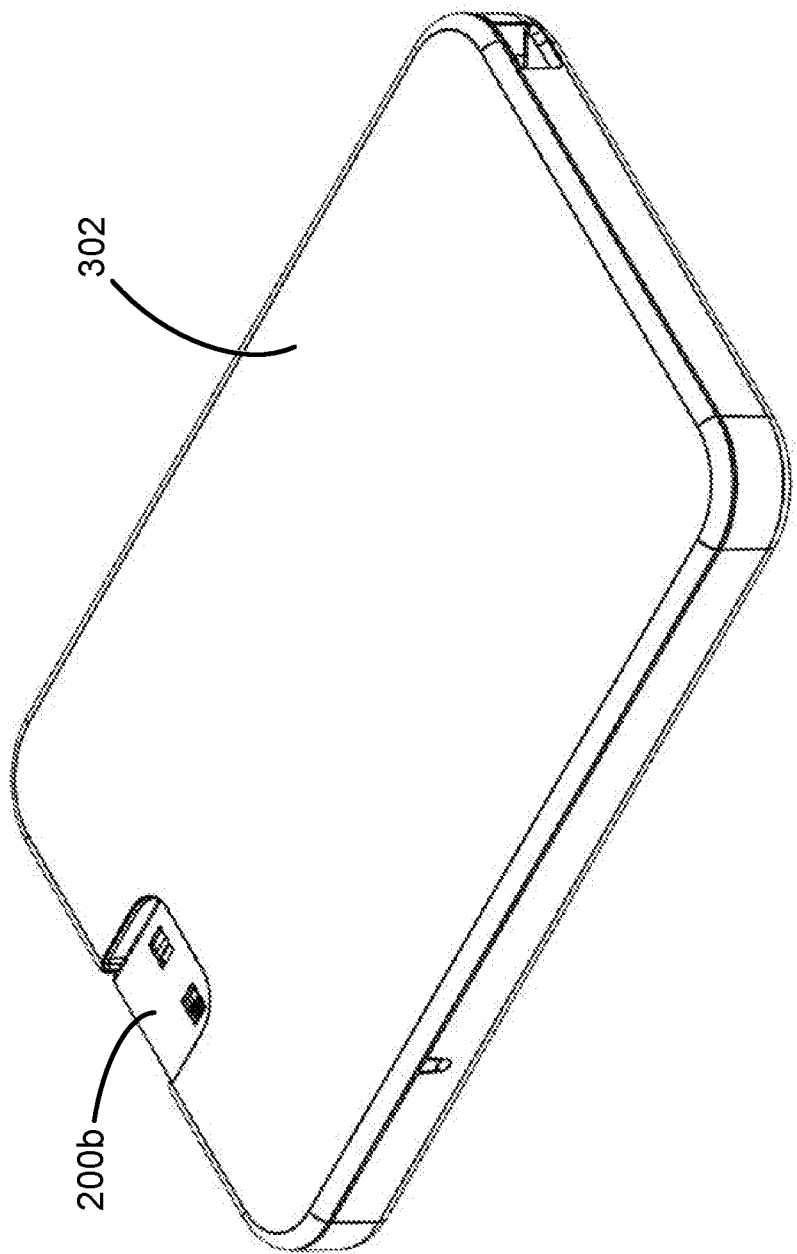
FIG. 16 provides an additional view of the large casing and storage unit.
Figure 17:
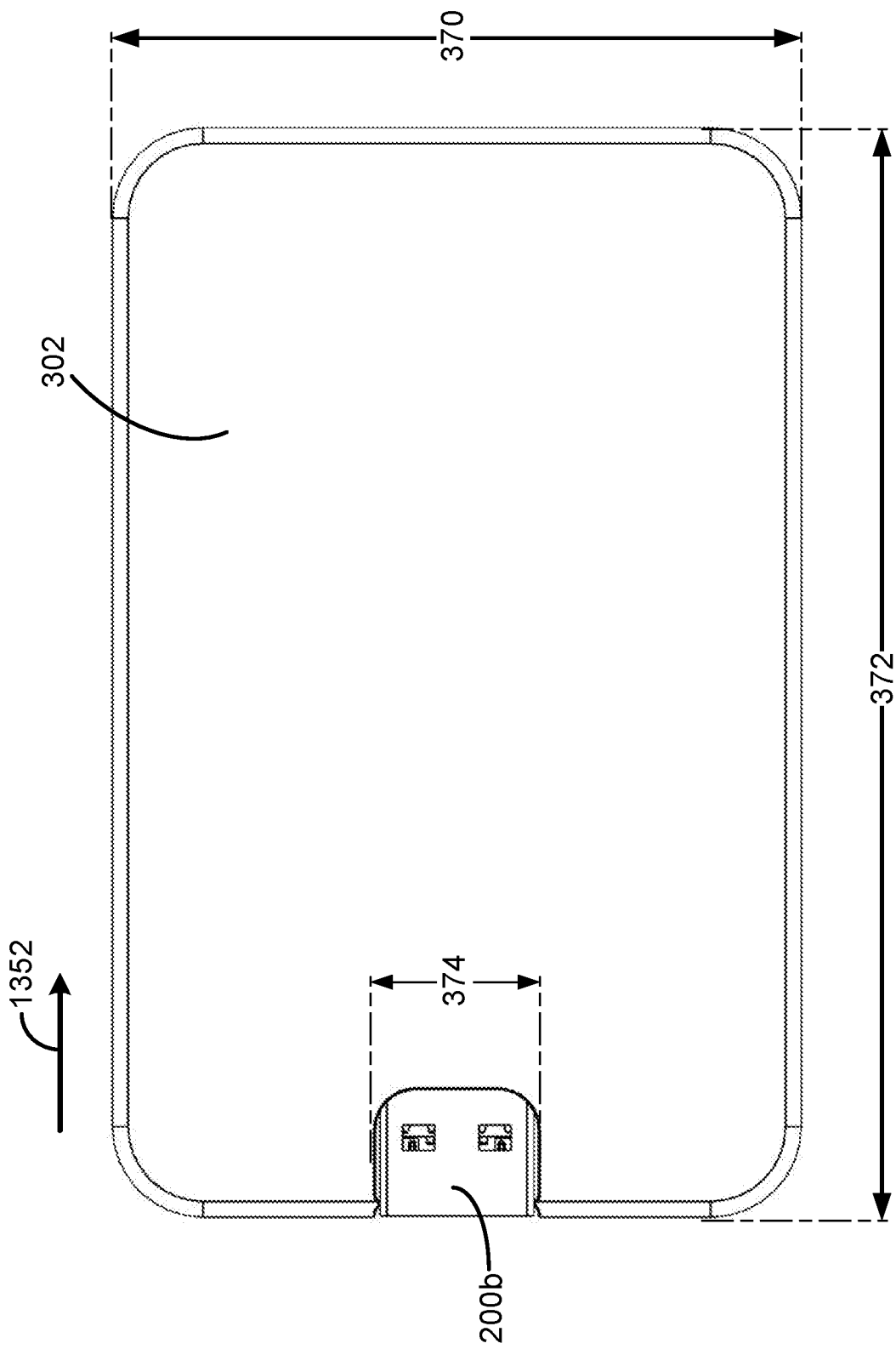
FIG. 17 provides another view of the large casing and storage unit of FIG. 16.

FIGS. 14 and 15 illustrate another exemplary robotic gripping mechanism (gripper) 408a similar with the gripper 408 illustrated in FIG. 8. The primary function of the gripping mechanism 408a is to facilitate movement of the assembled case-and-storage unit to and from the printer tray, to flip the casing to the second side following printing of the first side, and to carry the finished, printed product to a finished product bin 418, using vertical movements from the lift 410, rotation from the wrist 902, and outward movements of the arms, or claws 904. The gripper illustrated in FIGS. 14 and 15 is comprised of one microcontroller and a number of motors and sensors that drive the gripper to perform its functions. PCBA (Printed Circuit Board Assembly) A 804 receives information from clamp 2000 and 2001, rotation 910 and case present 2000 and 2001 sensors to guide gripper functions and controls and activates a casing rotate motor 908. A casing present sensor 2000 and 2001 provides the controller with an indication of whether a card is in the claw (arms) 904, or if it has been picked up but fallen off the grip 904. PCBA B 906 provides a tie point for the dynamic cables that move with the gripper 408. Cables are highly flexible and run between PCBA A 804 and PCBA B 906. Both arms 904 move with the cable as the wrist rotates, but do not flex in any direction. Casings are gripped with a flip pad 916 or similar element, allowing it to flip the casing from one side to another. Arms 904, or claws, move outward and rotate. The claw motor 920 drives the cam 1006 to spread the arms apart 904 (see FIG. 15). A tray present sensor 2000 and 2001 informs the gripper controller of the presence or absence of the printer tray 810, specifically, the precise vertical location of the printer tray and indicating when the case and storage unit may be loaded into the tray 810. Referring to FIG. 15, PCBA C 1002 facilitates the functionality of the clamp sensor 2000 and 2001 for the gripper arms.

Referring now to FIGS. 16-24, additional details about the storage unit 200b and the large 302 casing are shown. As previously described, the storage unit 200b slides within the large 302 casing between a closed position (FIGS. 17-18) and an open position (FIGS. 19-21) whereupon the storage unit 200b can be connected with the USB port on a computing system.

Figure 22:
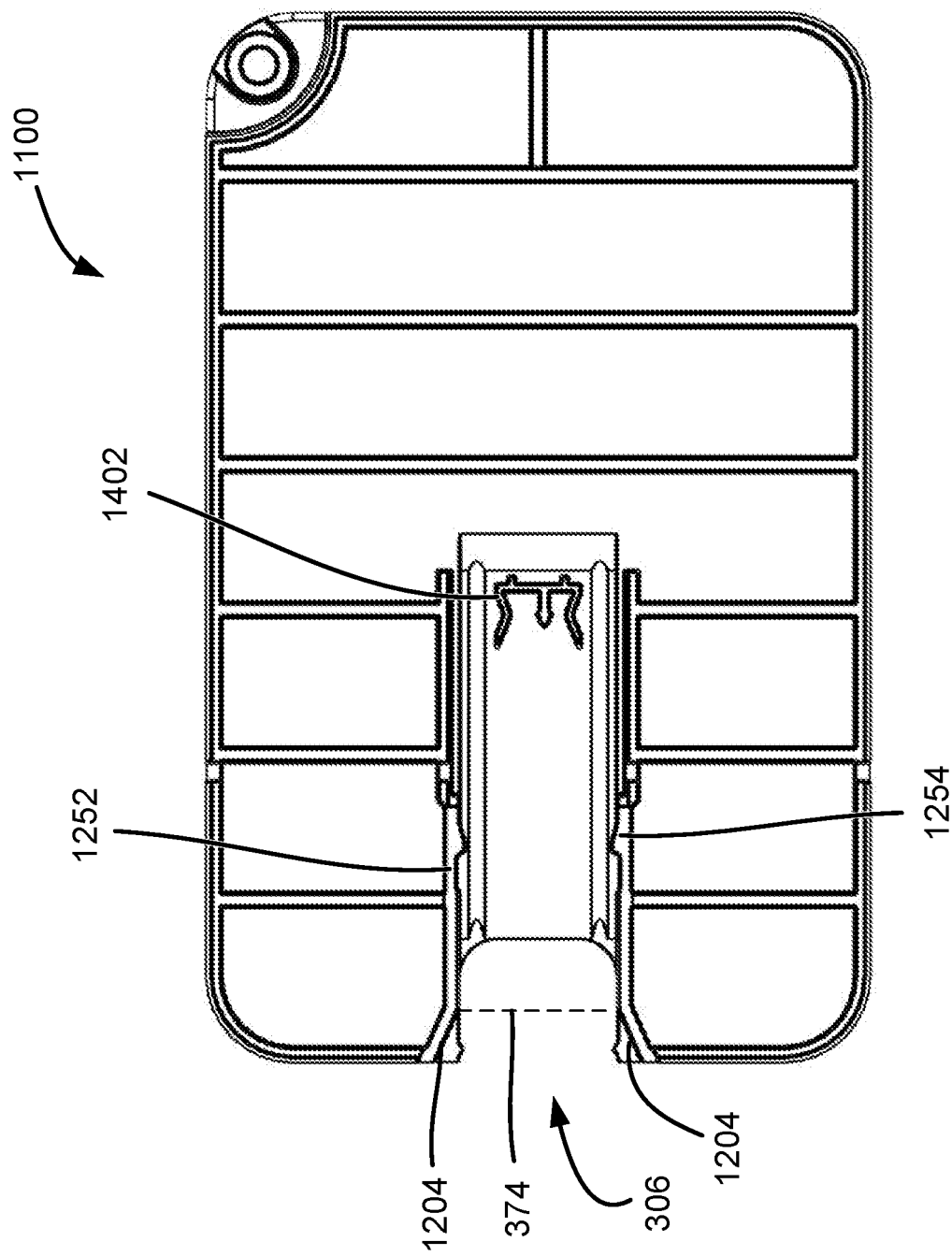
FIG. 22 provides a view of a portion of the large casing of FIG. 16.
Figure 23:
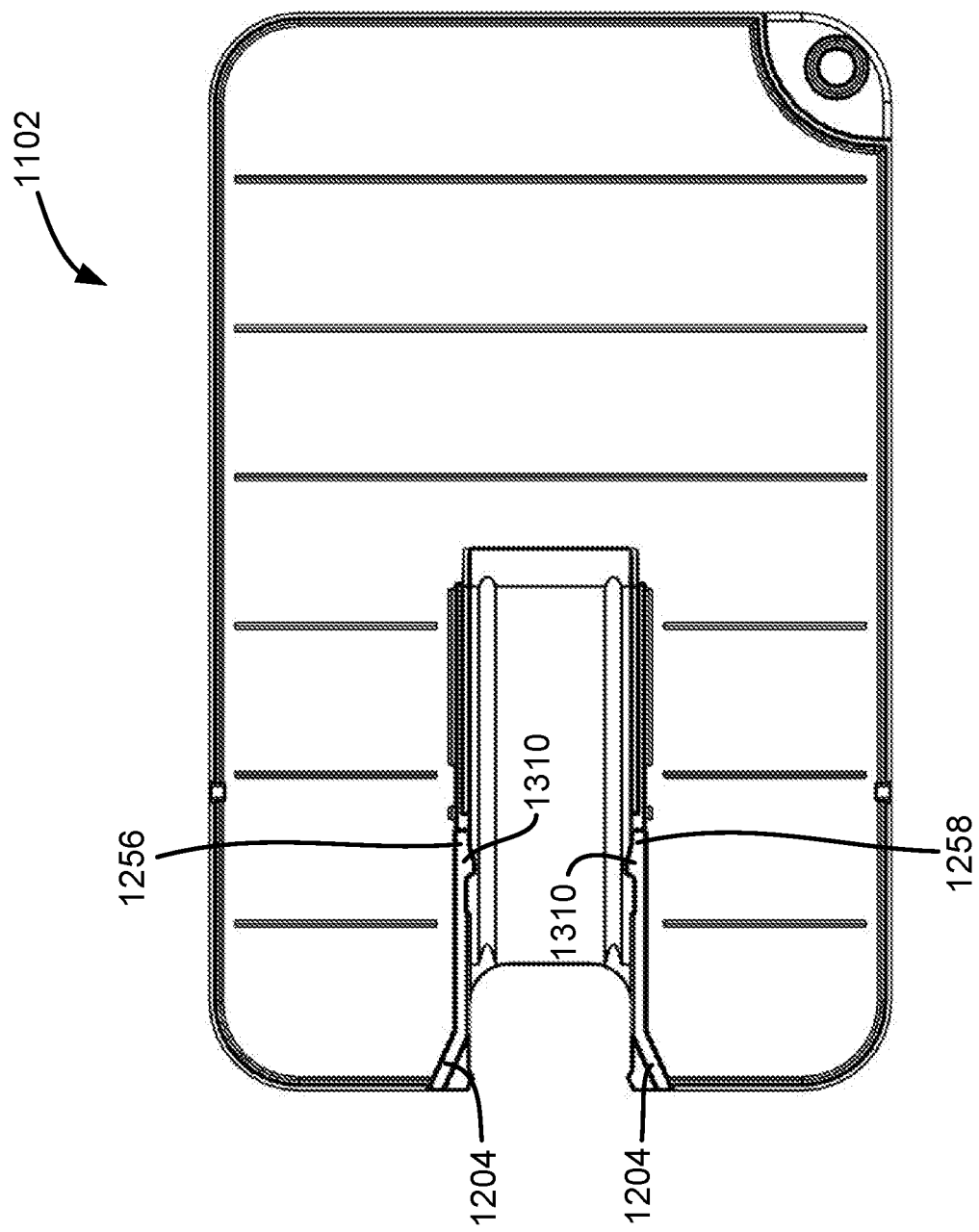
FIG. 23 provides a view of a portion of the large casing of FIG. 16.

The large 302 casing is formed from a first casing portion 1100 and a second casing portion 1102, as shown in FIGS. 22-23. The first casing portion 1100 is snapped together with the second casing portion 1102 to form the large 302 casing. In the example shown, the first casing portion 1100 is sonically welded to the second casing portion 1102. In the assembled state, the large 302 casing forms the slot 306 to receive the storage unit 200b.

Each of the first casing portion 1100 and the second casing portion 1102 include opposing slot walls 1252, 1254 and 1256, 1258 that together form the slot 306 within the large 302 casing. As described further below, the slot 306, including the slot walls 1252, 1254 and 1256, 1258, receives and guides the storage unit 200b within the large 302 casing.

In the example shown, the large 302 casing has a width 370 of 54 mm and a length 372 of 85.5 mm. The slot 306 has a width 374 of 13 mm. Other dimensions can be used. For instance, the small 304 casing has a width 380 of 25 mm and a length 382 of 54 mm.

Figure 24:
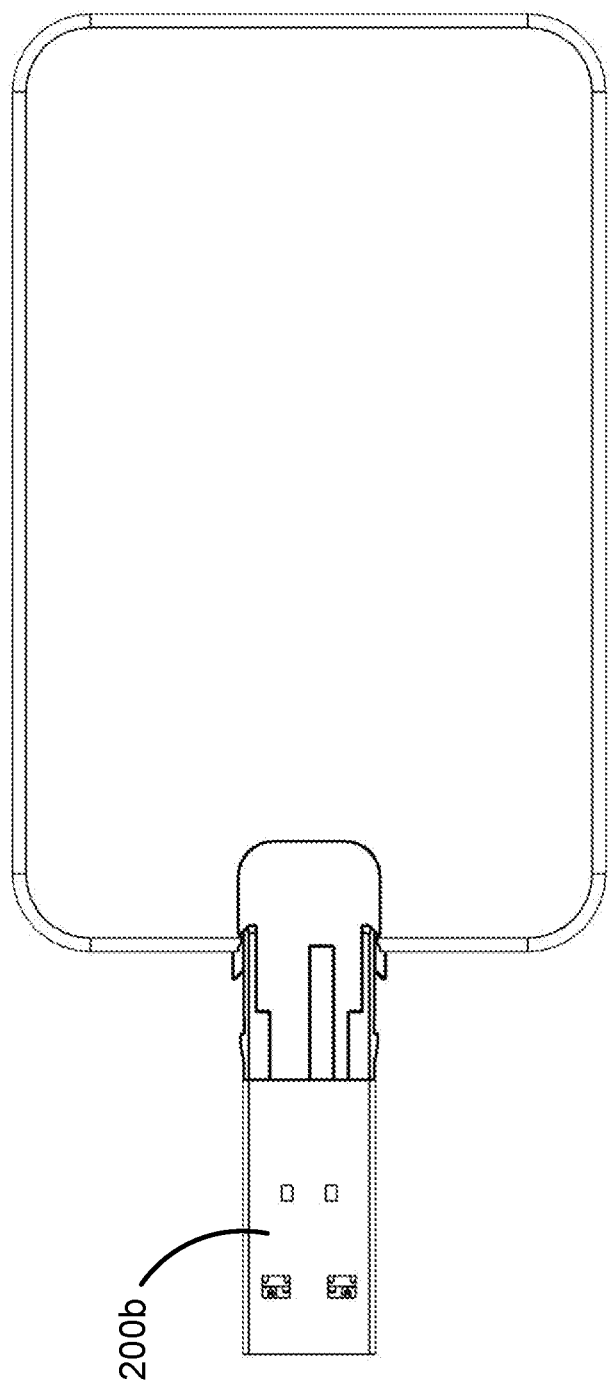
FIG. 24 provides a view of assembly of the large casing and storage unit of FIG. 16.
Figure 25:
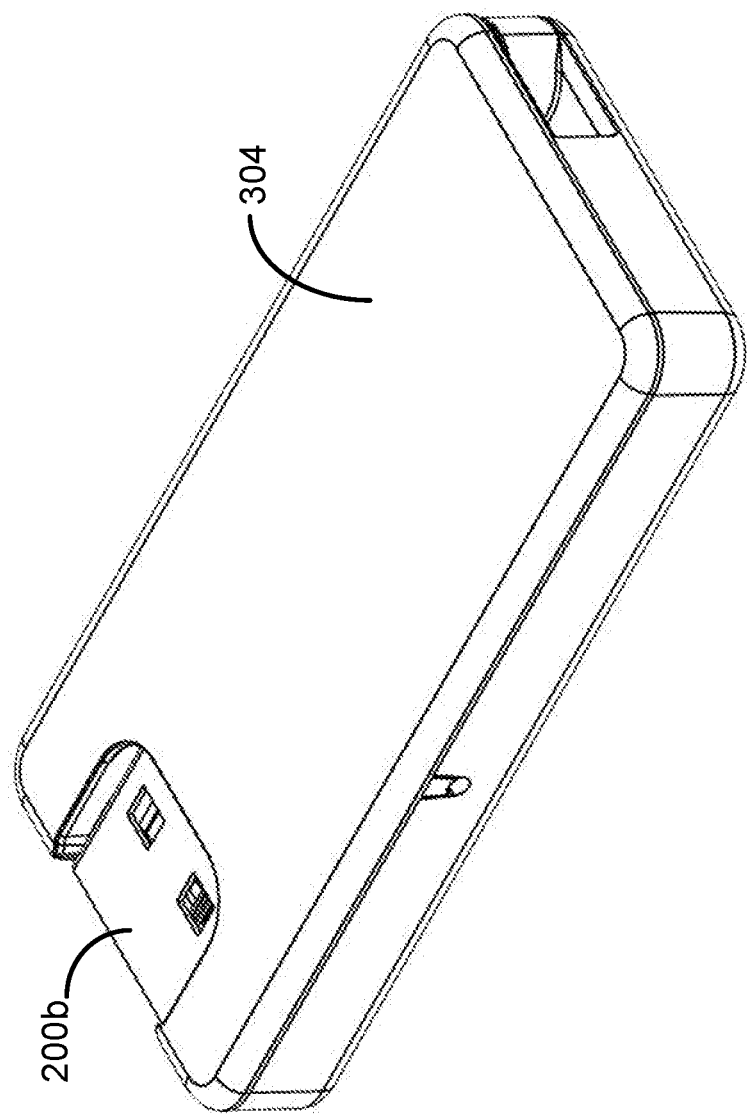
FIG. 25 provides an additional view of the small casing and storage unit.
Figure 26:
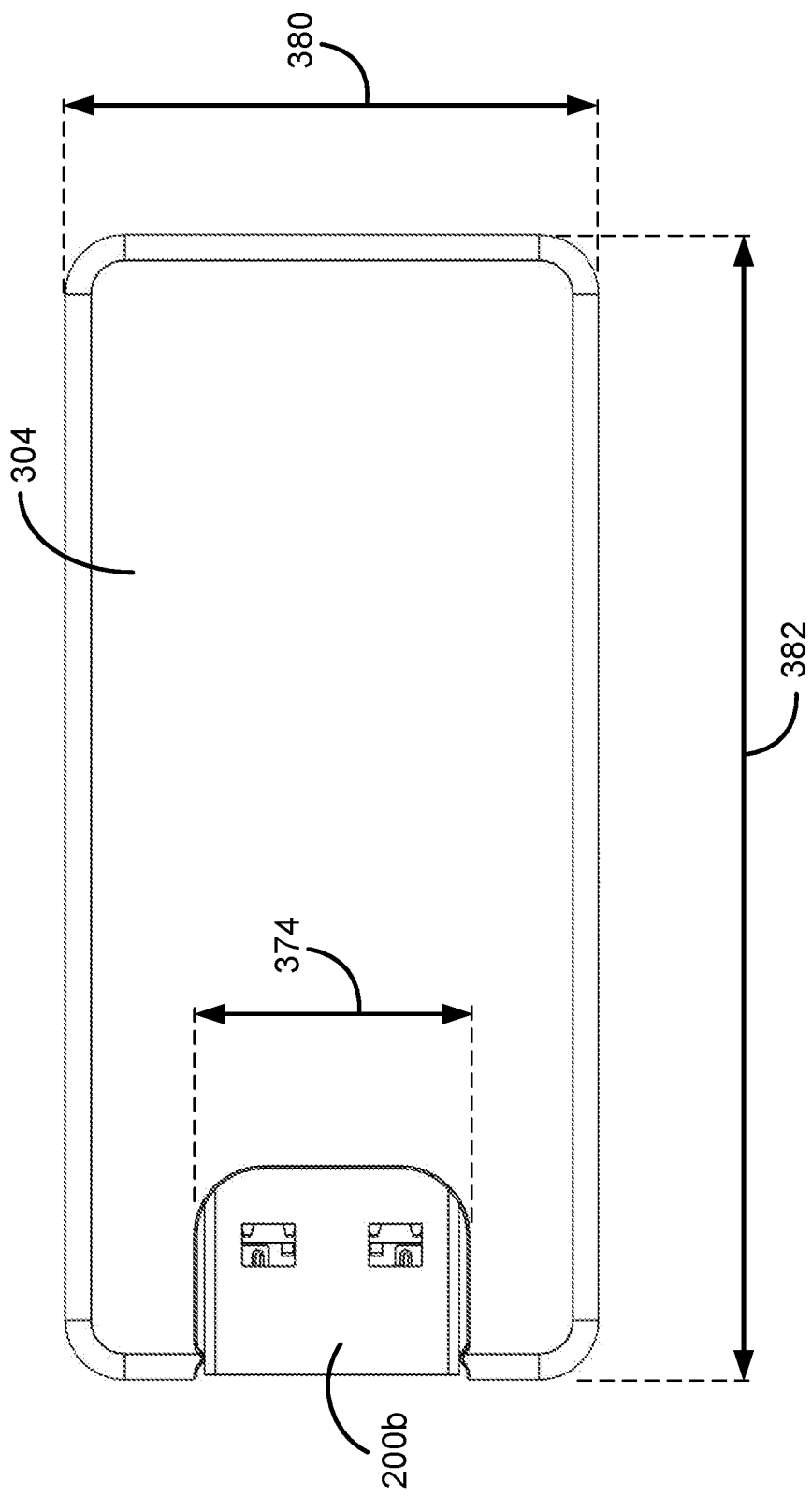
FIG. 26 provides another view of the large casing and storage unit of FIG. 25.
Figure 27:
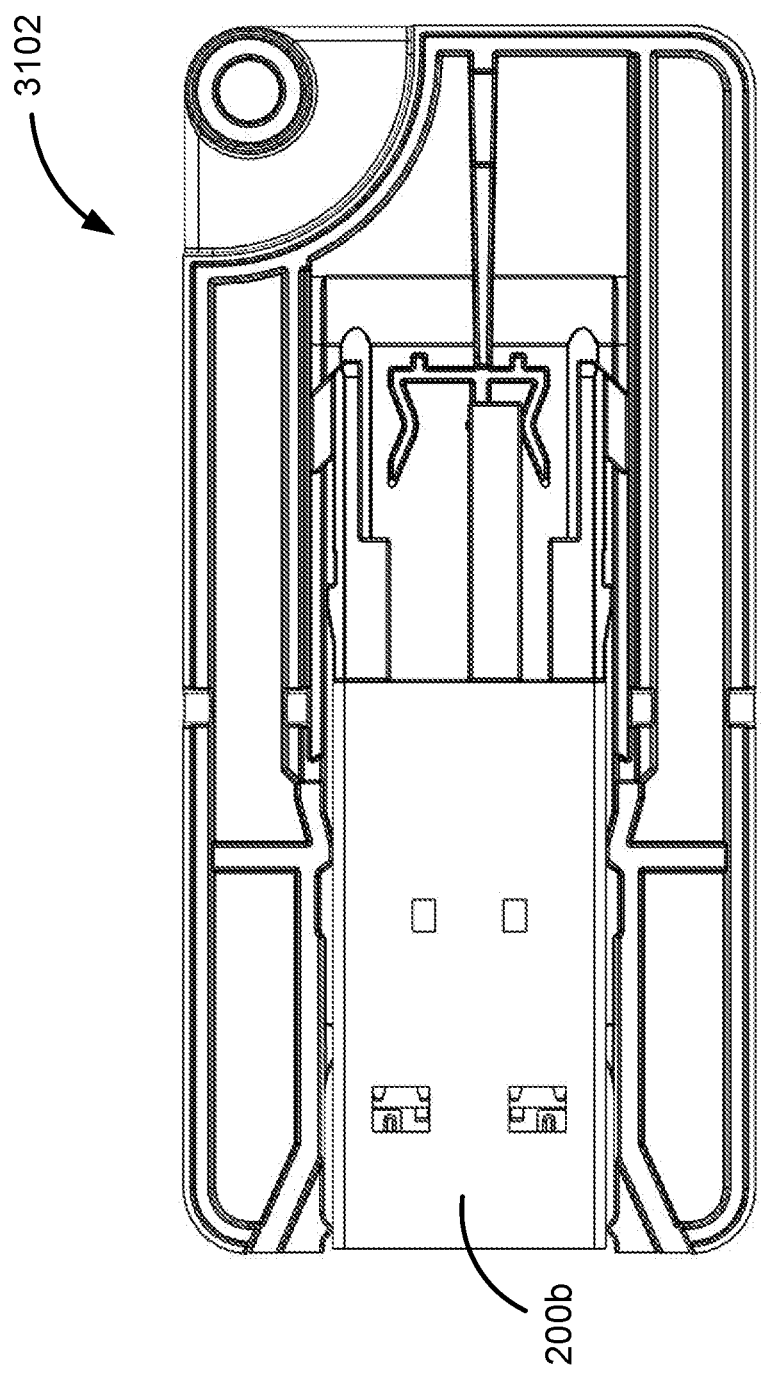
FIG. 27 provides a view of a portion of the large casing and storage unit of FIG. 25.
Figure 28:
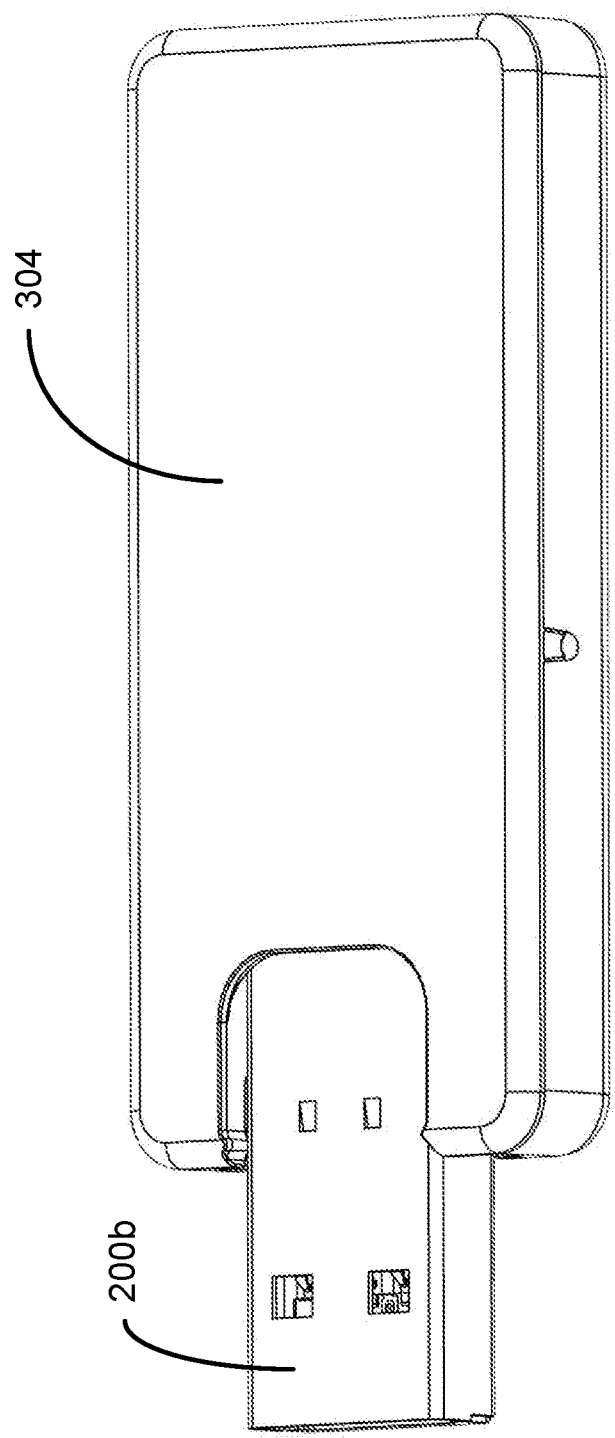
FIG. 28 provides another view of the large casing and storage unit of FIG. 25.
Figure 29:
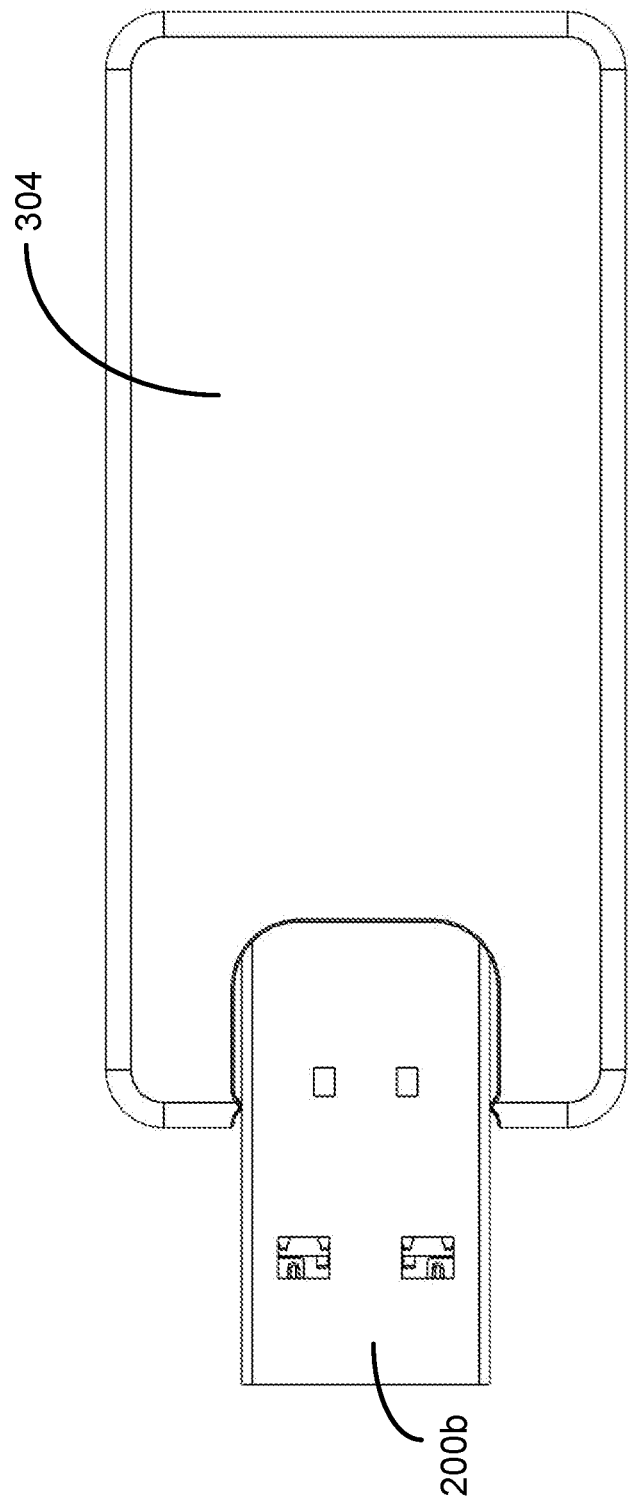
FIG. 29 provides another view of the large casing and storage unit of FIG. 25.
Figure 30:
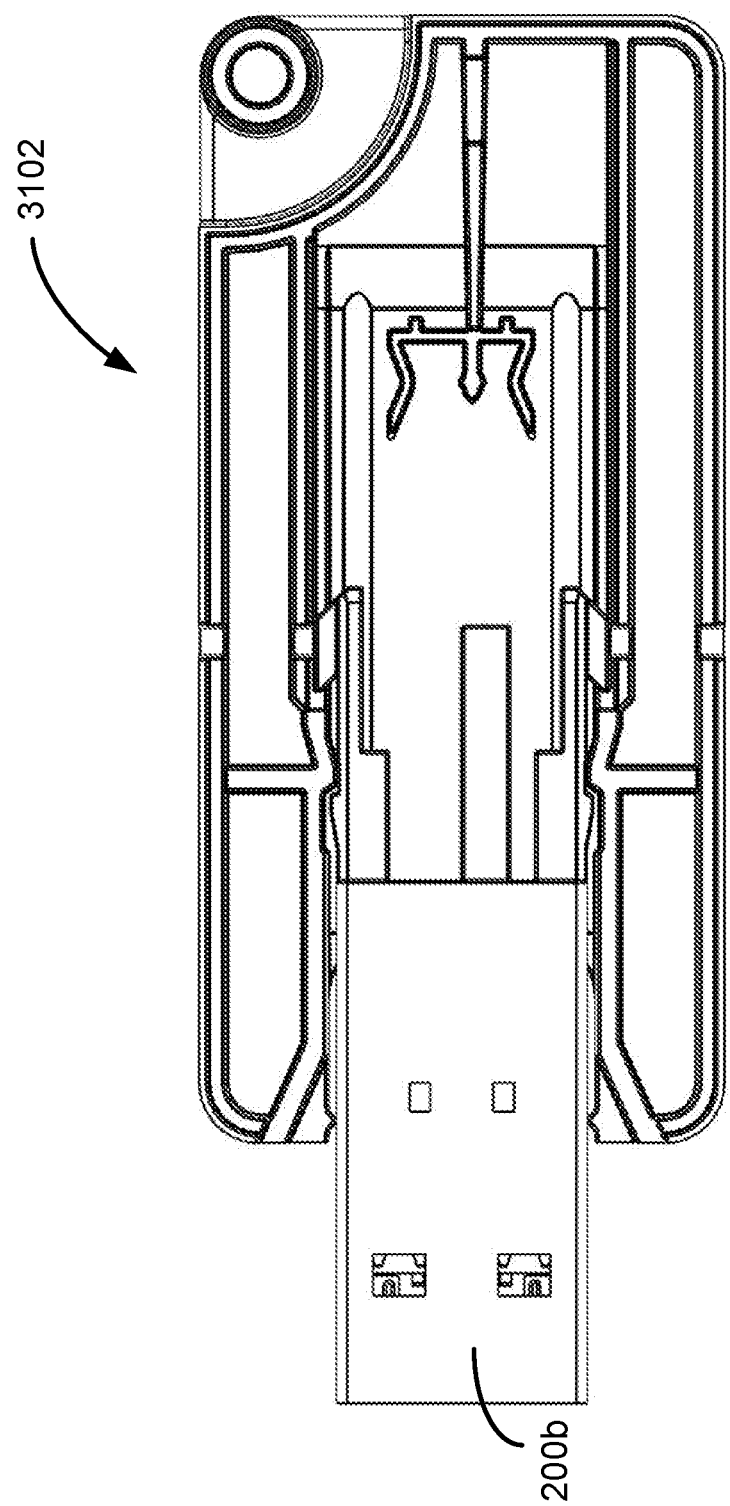
FIG. 30 provides a view of a portion of the large casing and storage unit of FIG. 25.
Figure 31:
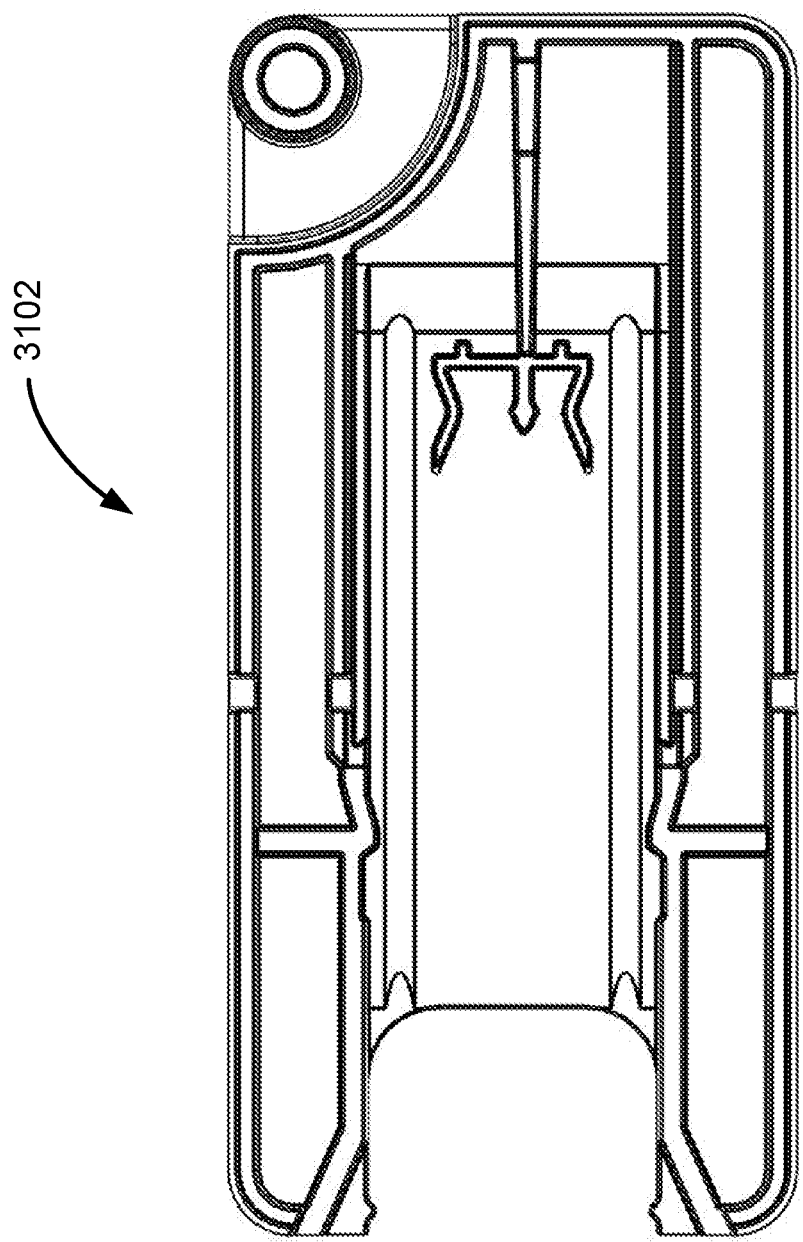
FIG. 31 provides a view of a portion of the large casing of FIG. 25.
Figure 32:
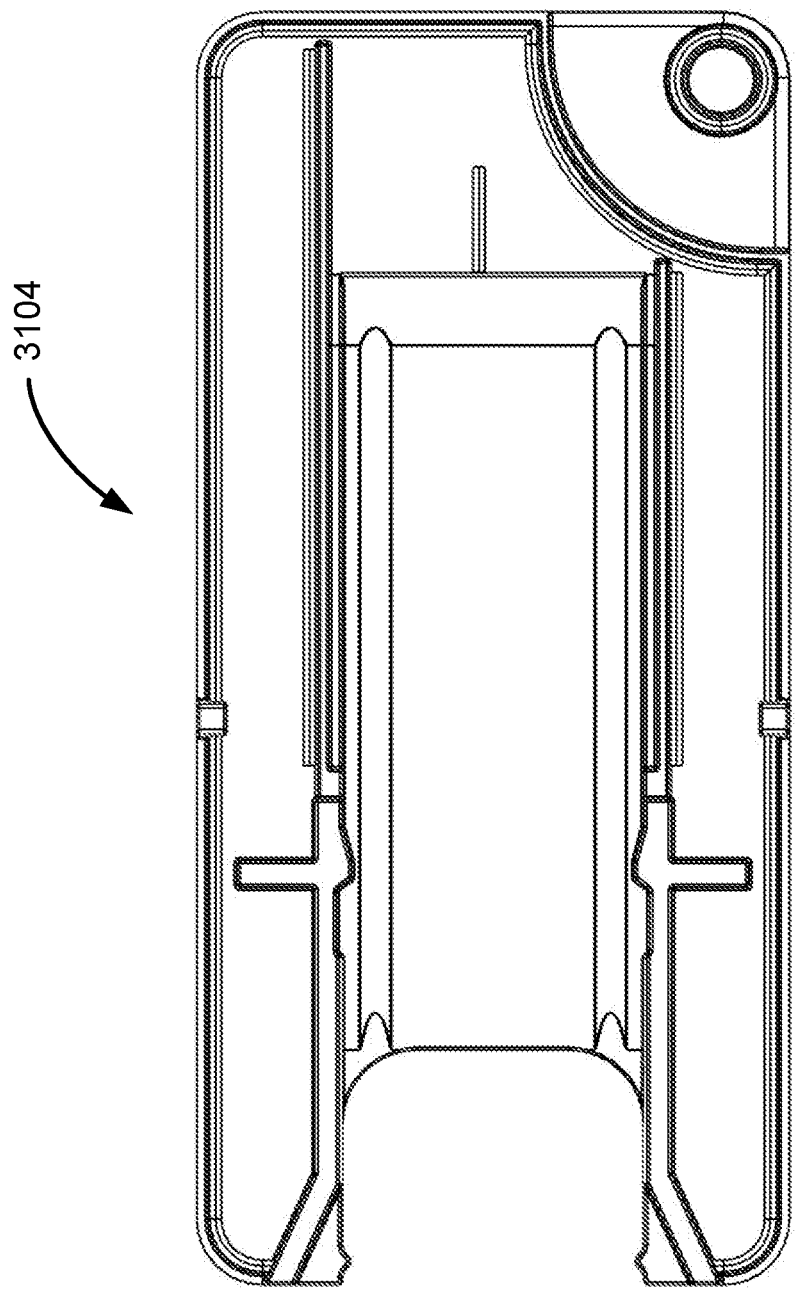
FIG. 32 provides a view of a portion of the large casing of FIG. 25.

As previously noted, the storage unit 200b includes flexible tines 210 that connect the storage unit 200b to the large 302 casing within the slot 306. As shown in FIG. 24, as the storage unit 200b is introduced into the slot 306, ramps 1204 formed in the slot 306 cause the flexible tines 210 to be flexed inward towards one another. The width 374 of the slot 306 is slightly less than the relaxed width formed between the flexible tines 210 so that the flexible tines 210 remain flexed as the storage unit 200b is inserted into the slot 306.

Figure 21:
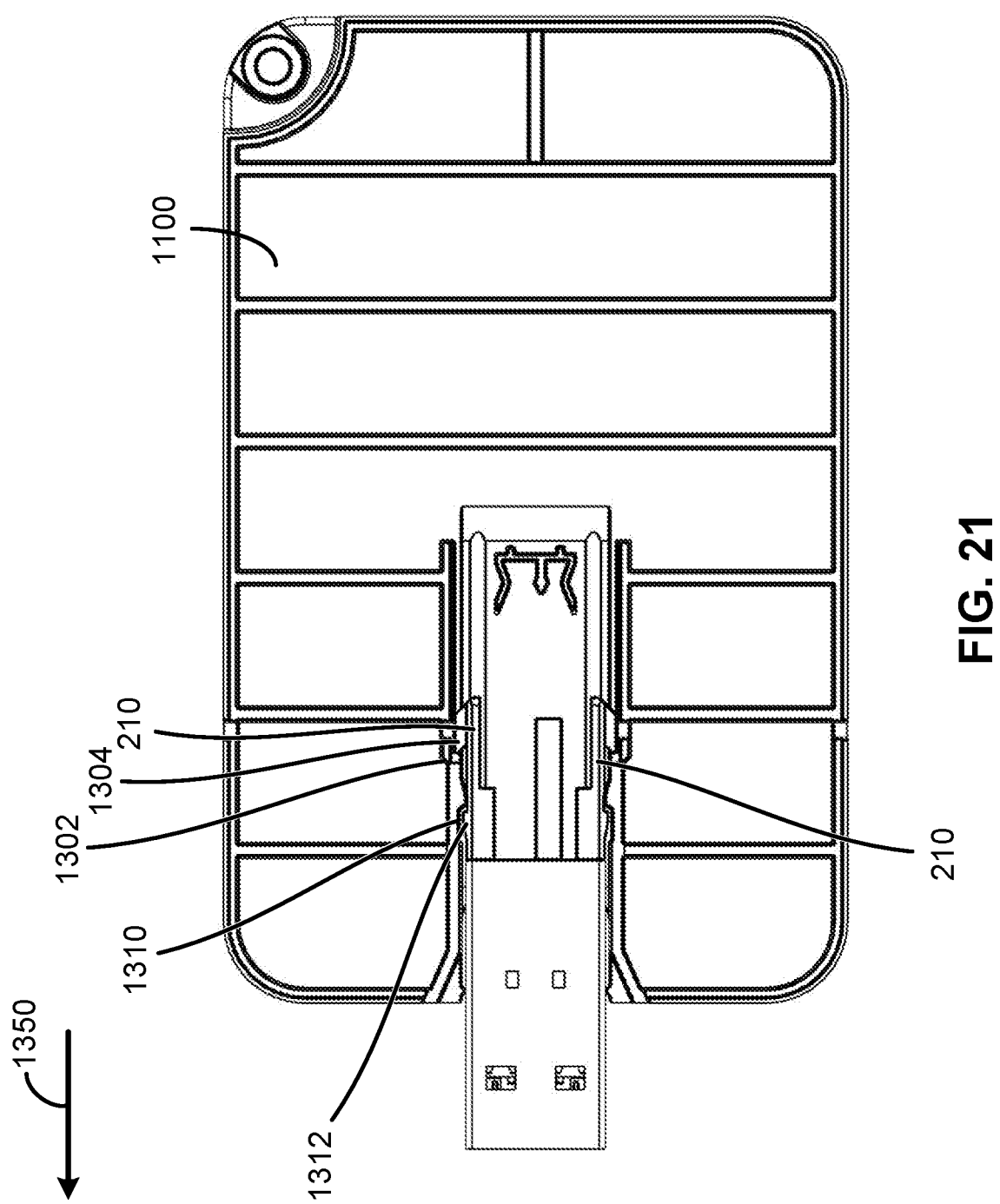
FIG. 21 provides a view of a portion of the large casing and storage unit of FIG. 16.

As shown in FIG. 21, as the storage unit 200b is pressed into the large 302 casing in a direction 1352, the flexible tines 210 eventually clear opposing shoulders 1302 formed in the slot walls 1252, 1254 and 1256, 1258 of the slot 306. Specifically, as shown in FIG. 7a, shuttle 718 moves and extracts the large 302 casing from the bottom of a magazine. The assembler 504 then moves to the storage unit magazine and shuttle 720 moves and extracts the storage unit 200b from the bottom of the magazine and inserts it into the large 302 casing.

At that point, the flexible tines 210 expand back to a relaxed state, and detents 1304 formed on the flexible tines 210 engage the shoulders 1302 so that the storage unit 200b is coupled to the large 302 casing. In this position, the storage unit 200b resists being pulled out of the large 302 casing. This is the open position, which is further defined by smaller shoulders 1310 formed in the slot 306 that engage knobs 1312 formed by the storage unit 200b to generally hold the storage unit 200b in the open position.

Figure 18:
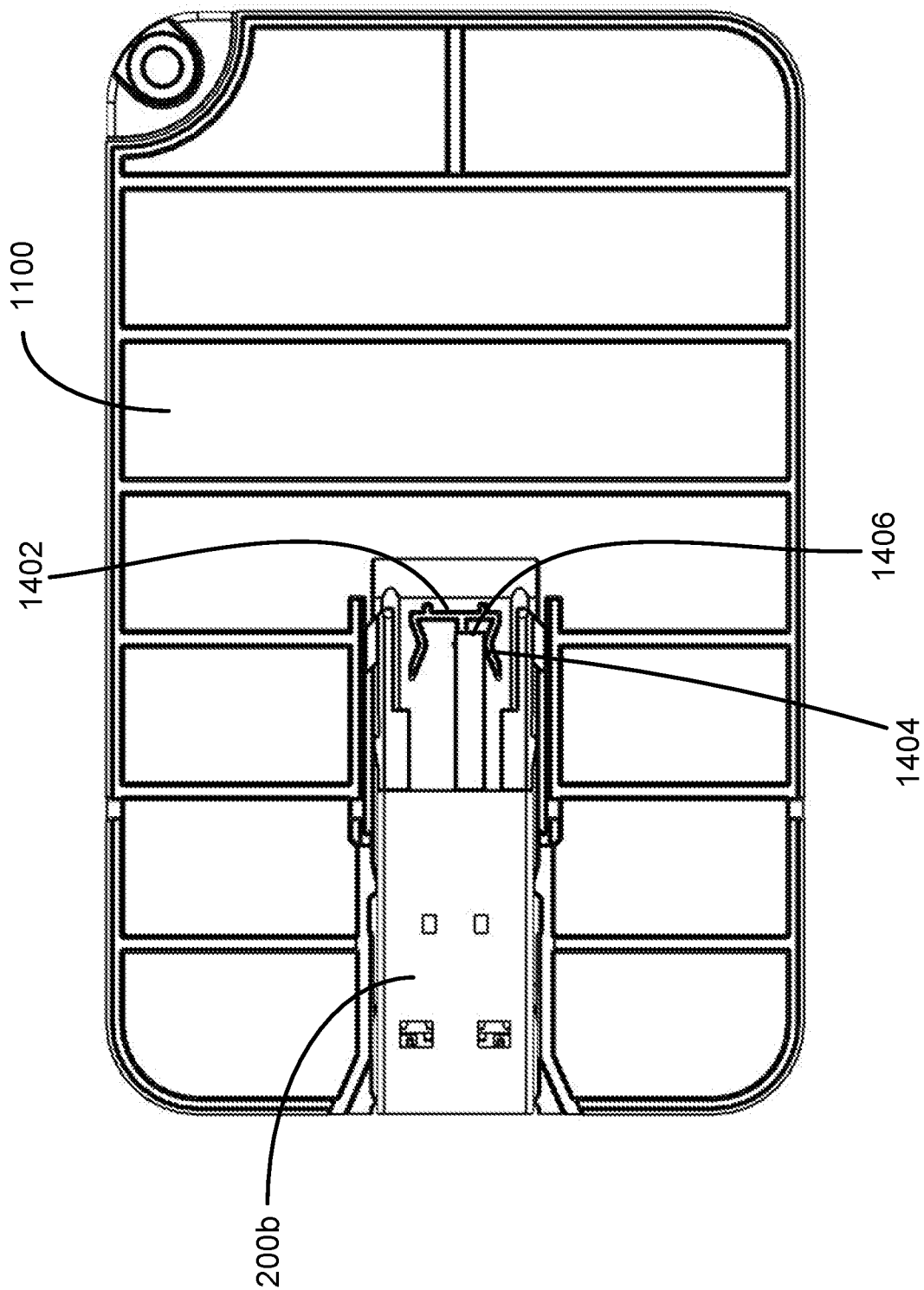
FIG. 18 provides a view of a portion of the large casing and storage unit of FIG. 16.
Figure 19:
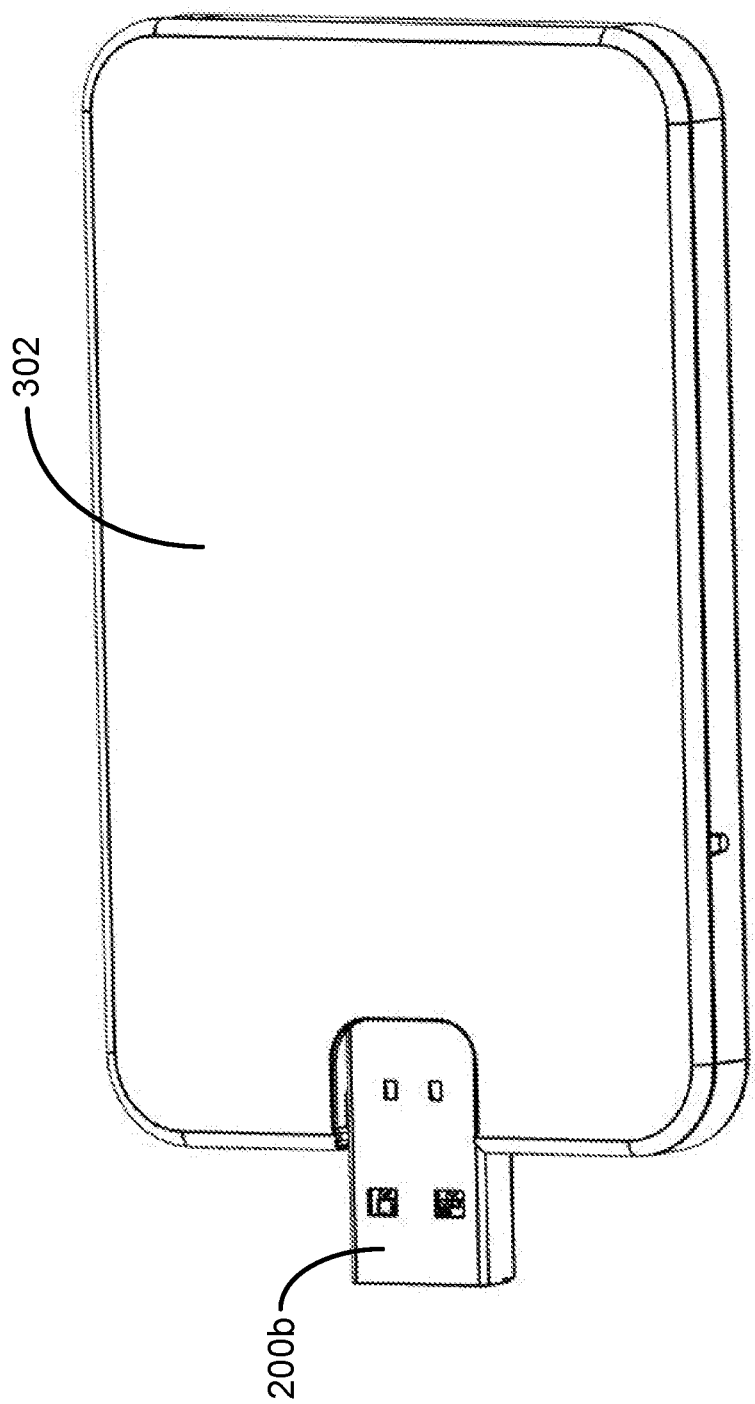
FIG. 19 provides another view of the large casing and storage unit of FIG. 16.
Figure 20:
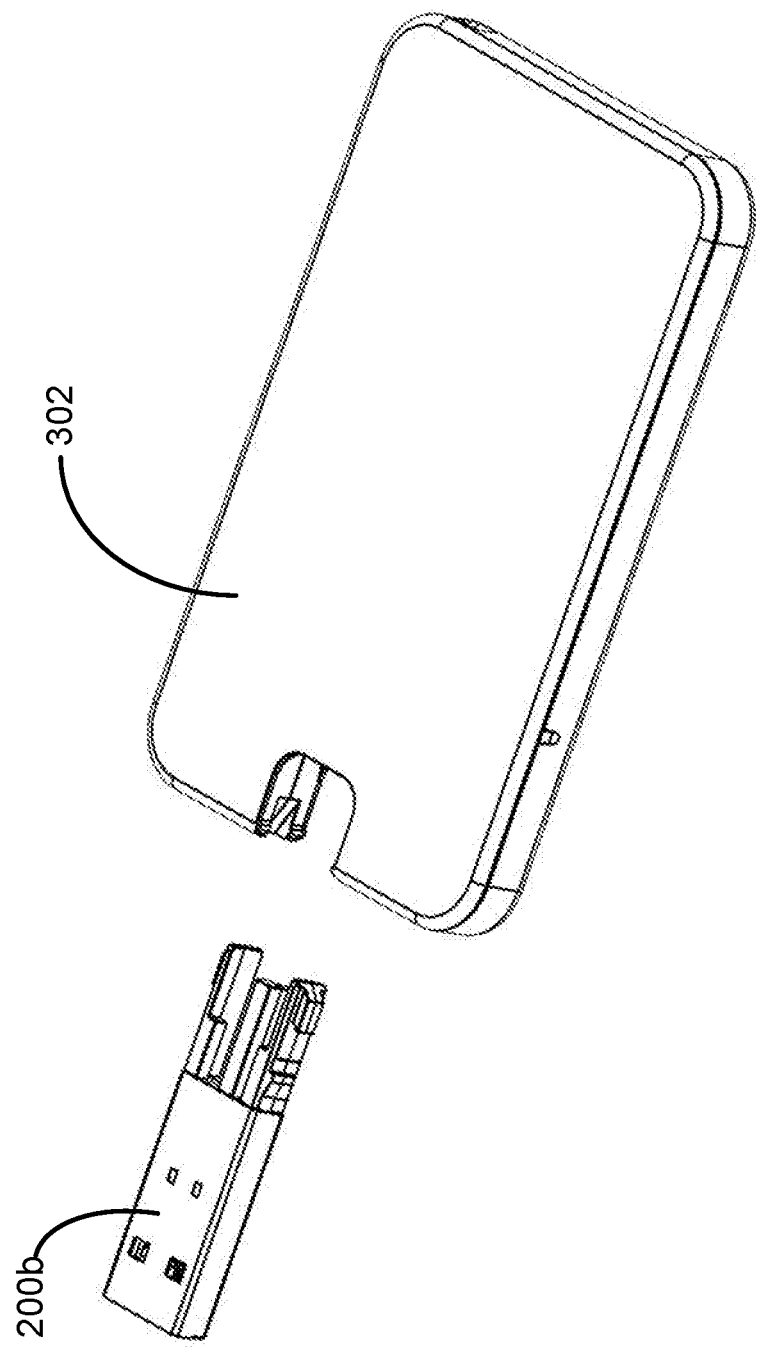
FIG. 20 provides another view of the large casing and storage unit of FIG. 16.

As shown in FIG. 18, as the storage unit 200b is forced further into the slot 306, the knobs 1312 clear the smaller shoulders 1310 and the storage unit 200b is free to travel further into the large 302 casing guided by the slot walls 1252, 1254 and 1256, 1258. The storage unit 200b is moved in the direction 1352 until an arm 1404 formed by the storage unit 200b engages a stopping portion 1402 formed by the first casing portion 1100 of the large 302 casing. In this position, the storage unit 200b is received fully within the slot 306, and further travel of the storage unit 200b into the large 302 casing is resisted. This is the closed position.

In this closed position, an end of the arm 1404 of the storage unit 200b engages a pocket 1406 formed in the stopping portion 1402 to hold the storage unit 200b in the closed position. This helps to retain the storage unit 200b in the closed position.

When a user wants to access the storage unit 200b (to, for example, connect the storage unit to the USB port on a computing system), the user can move the storage unit 200b from the closed position to the open position within the large 302 casing in a direction 1350. To do so, the user can grasp the storage unit 200b and pull the storage unit 200b out of the large 302 casing (overcoming the engagement of the arm 1404 within the pocket 1406) until the detents 1304 formed on the flexible tines 210 engage the shoulders 1302 so that the storage unit 200b resists being pulled out of the large 302 casing. As previously noted, in this open position, the smaller shoulders 1310 formed in the slot 306 engage knobs 1312 formed by the storage unit 200b to generally hold the storage unit 200b in the open position.

FIGS. 25-32 show the example small 304 casing and the storage unit 200b. The small 304 casing includes a first portion 3102 and a second portion 3104 that are sized differently from the large 302 casing. The small 304 casing otherwise functions in a manner similar to the large 302 casing.

While various aspects and embodiments have been disclosed herein, other aspects and embodiments will be apparent to those skilled in the art. The various aspects and embodiments disclosed herein are for purposes of illustration and are not intended to be limiting, with the true scope being indicated by the following claims, along with the full scope of equivalents to which such claims are entitled. It is also to be understood that the terminology used herein is for the purpose of describing particular embodiments only and is not intended to be limiting.

What is claimed is:

1. A storage unit for a Universal Serial Bus drive, the storage unit comprising:
 a casing integrated with a Universal Serial Bus data interface;
 a memory chip;

a connector that couples the memory chip to the casing; and opposing tines extending from the connector, the opposing tines being flexible to allow the storage unit to be inserted and retained in an outer casing.

2. The storage unit of claim 1, further comprising a detent formed on each of the opposing tines, the detent being positioned to engage a corresponding structure of an outer casing to hold the Universal Serial Bus drive within the outer casing.

3. The storage unit of claim 1, further comprising an arm extending from the connector, the arm being sized to engage a stop formed by an outer casing to define a fully-inserted state for the Universal Serial Bus drive within the outer casing.

4. A Universal Serial Bus drive, comprising:
an outer casing defining a slot; and
a storage unit including:
   a casing integrated with a Universal Serial Bus data interface;
   a memory chip;
   a connector that couples the memory chip to the casing; and
   opposing tines extending from the connector, the opposing tines being flexible to allow the storage unit to be inserted and retained in the slot of the outer casing.

5. The Universal Serial Bus drive of claim 4, further comprising a detent formed on each of the opposing tines, the detent being positioned to engage a corresponding shoulder defined in the slot of the outer casing to hold the Universal Serial Bus drive within the outer casing.

6. The Universal Serial Bus drive of claim 4, further comprising an arm extending from the connector, the arm being sized to engage a stop formed by the outer casing to define a fully-inserted state for the Universal Serial Bus drive within the outer casing.

7. The Universal Serial Bus drive of claim 4, wherein the outer casing is formed by a first portion and a second portion snapped together to form the outer casing.

8. The Universal Serial Bus drive of claim 4, wherein the outer casing is selected from multiple sizes.

9. The Universal Serial Bus drive of claim 4, wherein the outer casing defines an outer surface upon which marks or indications are printed.

10. A system, comprising
a recording device for recording information on a memory chip;
a bin platform containing raw material bins;
an outer casing defining a slot;
a memory chip including:
   a casing integrated with a Universal Serial Bus data interface;
   a memory;
   a connector that couples the memory chip to the casing; and
   opposing tines extending from the connector;
an assembler subsystem movably attached to the bin platform, the assembler subsystem comprising a shuttle for removing the outer casing from a casing bin and the memory chip from a memory bin and assembling the two into a single unit by applying pressure to flex the opposing tines to allow the storage unit to be inserted and retained in the slot of the outer casing; and
a printing device for printing marks or indications on the outer casing.

11. The system of claim 10, further comprising a detent formed on each of the opposing tines, the detent being positioned to engage a corresponding shoulder defined in the slot of the outer casing to hold the memory chip within the outer casing.

12. The system of claim 10, further comprising an arm extending from the connector, the arm being sized to engage a stop formed by the outer casing to define a fully-inserted state for the memory chip within the outer casing.

13. The system of claim 10, wherein the outer casing is formed by a first portion and a second portion snapped together to form the outer casing.

14. The system of claim 10, wherein the outer casing is selected from multiple sizes.

15. The system of claim 10, wherein the outer casing defines an outer surface upon which marks or indications are printed.

16. The system of claim 10, wherein the bin platform further includes a casing bin and a storage bin.

17. The system of claim 10, wherein the assembler subsystem further includes a gripping mechanism including arms configured to grip and move the single unit from the assembler subsystem to the printing device.

18. The system of claim 10, wherein the recording device is configured to record digital content on the memory.

19. The system of claim 10, further comprising data storage that stores media files including the marks or indications.

20. The system of claim 19, wherein the system including a processing device programmed to access the media files and cause the printing device to print the marks or indications on the casing.

* * * * *